United States Patent
Shimizu et al.

(10) Patent No.: US 11,011,386 B2
(45) Date of Patent: May 18, 2021

(54) ETCHING METHOD AND PLASMA TREATMENT DEVICE

(71) Applicant: Tokyo Electron Limited, Tokyo (JP)

(72) Inventors: Yusuke Shimizu, Miyagi (JP); Masahiko Takahashi, Hwaseong-si (KR)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/644,062

(22) PCT Filed: Jun. 5, 2019

(86) PCT No.: PCT/JP2019/022416
§ 371 (c)(1),
(2) Date: Mar. 3, 2020

(87) PCT Pub. No.: WO2019/239991
PCT Pub. Date: Dec. 19, 2019

(65) Prior Publication Data
US 2021/0074550 A1    Mar. 11, 2021

(30) Foreign Application Priority Data

Jun. 15, 2018   (JP) .............................. JP2018-114692

(51) Int. Cl.
*H01L 21/311* (2006.01)
*H01J 37/32* (2006.01)
*H01L 21/3065* (2006.01)

(52) U.S. Cl.
CPC .. *H01L 21/31144* (2013.01); *H01J 37/32082* (2013.01); *H01J 37/32449* (2013.01);
(Continued)

(58) Field of Classification Search
CPC .......... H01L 21/31144; H01L 21/3065; H01L 21/31116; H01J 37/32449; H01J 37/32082; H01J 2237/334
(Continued)

(56) References Cited

U.S. PATENT DOCUMENTS

2015/0162203 A1*  6/2015  Kitamura ............ H01L 21/3065
                                                        438/710
2017/0053808 A1*  2/2017  Kamp ................. H01L 21/0223
(Continued)

FOREIGN PATENT DOCUMENTS

JP        2015-037091 A    2/2015

OTHER PUBLICATIONS

International Search Report issued in PCT/JP2019/022416; dated Aug. 6, 2019.

*Primary Examiner* — Binh X Tran
(74) *Attorney, Agent, or Firm* — Studebaker & Brackett PC

(57) ABSTRACT

According to an exemplary embodiment, a method includes preparing a workpiece including a silicon film and a mask provided on the silicon film, etching the silicon film using the mask by plasma of a gas containing a first halogen atom, modifying a surface of the silicon film into an oxide layer by plasma of a gas containing an oxygen atom, a hydrogen atom, and a second halogen atom, the oxide layer including a first region extending along a side wall surface of the mask and a second region extending on the silicon film, etching the oxide layer to remove the second region while leaving the first region, and etching the silicon film using the mask and the oxide layer including the first region by plasma of a gas containing a third halogen atom.

19 Claims, 24 Drawing Sheets

(52) U.S. Cl.
CPC .... *H01L 21/3065* (2013.01); *H01L 21/31116* (2013.01); *H01J 2237/334* (2013.01)

(58) Field of Classification Search
USPC ............... 438/710, 717, 719, 723, 753, 756
See application file for complete search history.

(56) References Cited

U.S. PATENT DOCUMENTS

| | | | |
|---|---|---|---|
| 2017/0345673 A1* | 11/2017 | Ranjan | H01L 21/0337 |
| 2018/0226259 A1* | 8/2018 | Choi | H01L 21/3086 |
| 2018/0286695 A1* | 10/2018 | Sako | H01L 21/76814 |

* cited by examiner

ETCHING METHOD AND PLASMA TREATMENT DEVICE

TECHNICAL FIELD

An exemplary embodiment of the present disclosure relates to an etching method and a plasma treatment device.

BACKGROUND ART

Patent Document 1 discloses an etching method for forming a dummy gate of a fin-type field effect transistor. In this method, a gate material formed of amorphous silicon (a-Si) is etched using a mask of silicon nitride (SiN). The etching gas is a mixed gas of an argon (Ar) gas, a hydrogen bromide (HBr) gas, and an oxygen ($O_2$) gas.

CITATION LIST

Patent Document

[Patent Document 1] Japanese Unexamined Patent Publication No. 2015-37091

SUMMARY OF INVENTION

Technical Problem

The present disclosure provides a technology capable of etching a silicon film as designed.

Solution to Problem

According to one exemplary embodiment, an etching method includes preparing a workpiece including a silicon film and a mask provided on the silicon film, etching the silicon film using the mask by plasma of a gas containing a first halogen atom, modifying a surface of the silicon film into an oxide layer by plasma of a gas containing an oxygen atom, a hydrogen atom, and a second halogen atom, the oxide layer including a first region extending along a side wall surface of the mask and a second region extending on the silicon film, etching the oxide layer to remove the second region while leaving the first region, and etching the silicon film using the mask and the oxide layer including the first region by plasma of a gas containing a third halogen atom.

Advantageous Effects of Invention

According to the etching method according to one exemplary embodiment, it is possible to etch a silicon film as designed.

DESCRIPTION OF EMBODIMENTS

Figure 1:
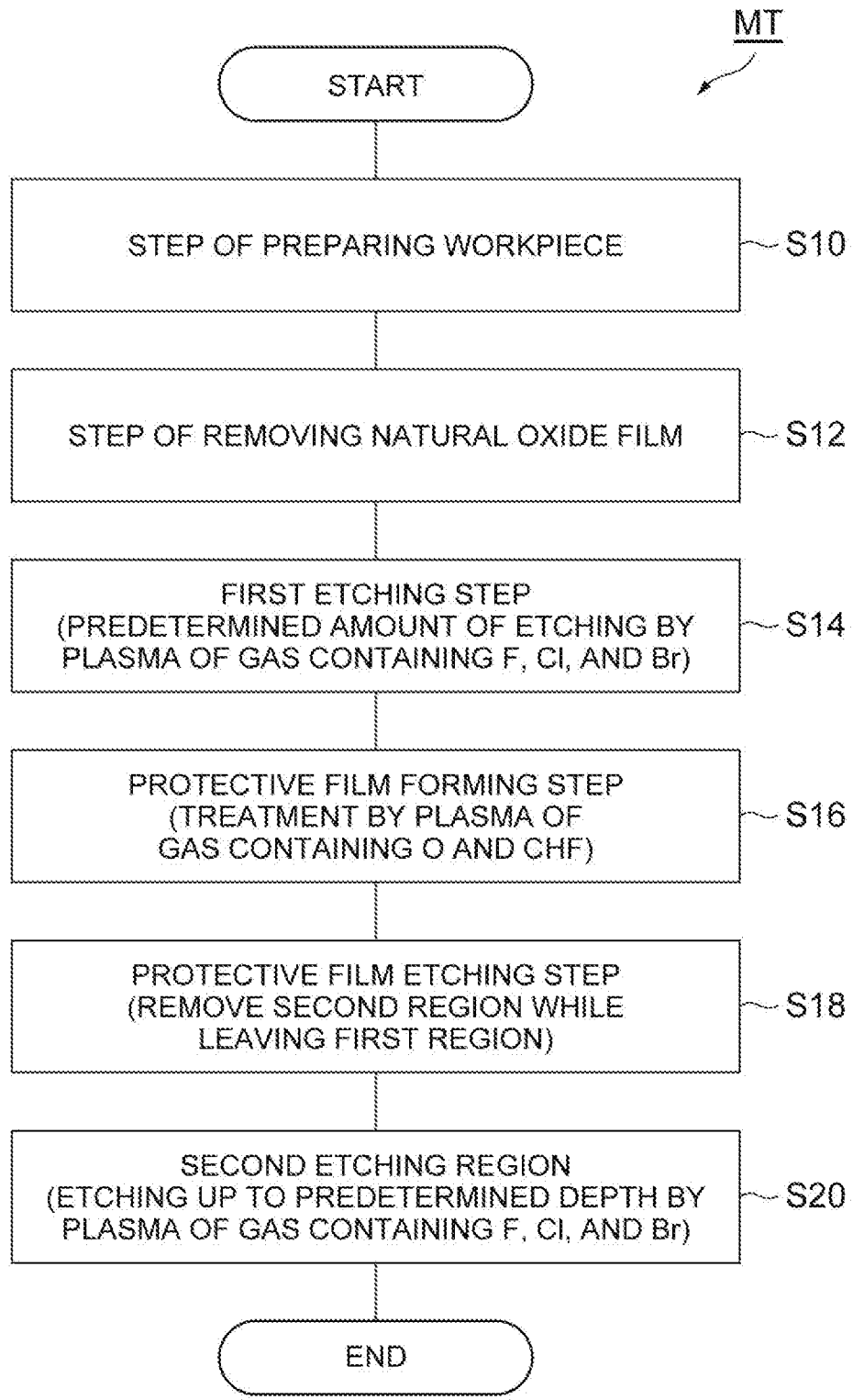
FIG. 1 is a flowchart illustrating an etching method according to one exemplary embodiment.

Hereinafter, various exemplary embodiments will be described.

In a case where a silicon film is etched using a mask by plasma of a gas, there are portions where etching is difficult depending on a mask pattern. For example, a region of the silicon film located below a mask end such as a corner of a pattern is hardly etched and has a skirt shape. In order to improve the skirt shape of the silicon film, it is considered to perform over-etching. Over-etching refers to performing etching for a long time with respect to just etching. Just etching refers to ending etching when a silicon film is etched and removed, and thus a surface of a base layer appears. The etching amount is increased by over-etching, and thereby it is possible to improve the skirt shape of the silicon film below the mask end.

However, in a case where the etching amount is increased by over-etching, etching also proceeds in a lateral direction of the silicon film. Therefore, the silicon film may have a bowing shape. As described above, the improvement of the skirt shape of the silicon film below the mask end and avoidance of the bowing shape have a trade-off relationship.

According to one exemplary embodiment, an etching method is provided. The etching method according to one exemplary embodiment includes preparing a workpiece including a silicon film and a mask provided on the silicon film, etching the silicon film using the mask by plasma of a gas containing a first halogen atom, modifying a surface of the silicon film into an oxide layer by plasma of a gas containing an oxygen atom, a hydrogen atom, and a second halogen atom, the oxide layer including a first region extending along a side wall surface of the mask and a second region extending on the silicon film, etching the oxide layer to remove the second region while leaving the first region, and etching the silicon film using the mask and the oxide layer including the first region by plasma of a gas containing a third halogen atom.

The etching method includes modifying the surface of the silicon film into an oxide layer during the etching of the silicon film. In the step, plasma of a gas containing an oxygen atom, a hydrogen atom, and a second halogen atom is used. An oxygen radical causes the surface of the silicon film to be oxidized. At this time, the radical of the second halogen atom enters into silicon crystal from the surface of the silicon film. The entering radical of the second halogen atom breaks a Si—Si bond and combines with silicon, or creates a dangling bond of silicon. The oxygen radical can be bonded to the dangling bond of silicon broken by the radical of the second halogen atom. Therefore, the oxygen radical can be bonded to silicon at a deeper position by using the radical of the second halogen atom. Thus, the surface of the silicon film can be modified up to a deeper position.

A hydrogen radical can scavenge an excessive halogen atom which remains on the side wall and the like of a treatment vessel and re-dissociates, or the second halogen atom incorporated into the film. That is, the hydrogen radical can form an oxide layer in which a halogen atom is not contained. As a result, an oxide film having high etching resistance to the radical of the halogen atom is formed.

The high-purity and thick oxide layer as described above is formed on the side wall (first region) of the silicon below the mask end. Since the formed oxide film acts as a sidewall protective film, the progress of etching in the lateral direction is suppressed. Thus, according to the etching method, the silicon film can be etched as designed.

In one exemplary embodiment, in the etching method, modifying the surface of the silicon film into the oxide layer, etching the oxide layer, and etching the silicon film using the mask and the oxide layer including the first region may be repeated. In this case, sidewall protection and etching are repeated. Thus, this etching method can etch to a deeper position while suppressing an abnormal shape.

In one exemplary embodiment, in the modifying the surface of the silicon film into an oxide layer, bias power may not be applied to the workpiece. In this case, since no ions are drawn into the workpiece, the anisotropy in a vertical direction is reduced, and the first region can be easily formed.

In one exemplary embodiment, the etching the silicon film using the mask, the modifying the surface of the silicon film into the oxide layer, the etching the oxide layer, and the etching the silicon film using the mask and the oxide layer including the first region may be continuously performed in the same treatment vessel. In this case, in the etching method, the etching can be completed without transporting the workpiece to the outside of the treatment vessel and without exposing the workpiece to the atmosphere during the treatment.

In one exemplary embodiment, the etching the silicon film using the mask, the modifying the surface of the silicon film into the oxide layer, the etching the oxide layer, and the etching the silicon film using the mask and the oxide layer including the first region may be continuously performed in different treatment vessels by transporting the workpiece in a consistent vacuum environment. In this case, in the etching method, it is possible to complete the etching without exposing the treatment target to the atmosphere during the treatment.

According to another exemplary embodiment, an etching method is provided. The etching method includes preparing a workpiece including a silicon film and a mask provided on the silicon film, etching the silicon film using the mask by plasma of a gas containing a first halogen atom, modifying a first region extending along a side wall surface of the mask in the surface of the silicon film into an oxide layer by plasma of a gas containing an oxygen atom, a hydrogen atom, and a second halogen atom, and etching the silicon film using the mask and the oxide layer including the first region by plasma of a gas containing a third halogen atom.

In still another exemplary embodiment, in the modifying the first region into the oxide layer, bias power may be applied to the workpiece. In this case, ions are drawn into the workpiece. The oxide layer includes the first region extending along the side wall surface of the mask and a second region extending on the silicon film, but the second region is immediately etched and removed by the ions. That is, according to still another exemplary embodiment, it is possible to omit removing the second region.

In the modifying the first region into the oxide layer, in the second region extending on the silicon film in the surface of the silicon film, an etching rate at which the oxide layer is etched by ions which are generated from the plasma of the gas containing the oxygen atom, the hydrogen atom, and the second halogen atom and contain the second halogen atom may be faster than or equal to a modification rate at which the silicon film is modified into the oxide layer by the plasma of the gas containing the oxygen atom, the hydrogen atom, and the second halogen atom.

In one or another exemplary embodiment, the gas containing the oxygen atom, the hydrogen atom, and the second halogen atom may be a mixed gas of a gas containing an oxygen atom and a gas containing a hydrogen atom and a second halogen atom.

In one or another exemplary embodiment, the gas containing the oxygen atom, the hydrogen atom, and the second halogen atom may be a mixed gas of a gas containing an oxygen atom, and a gas containing a hydrogen atom, a gas containing a second halogen atom.

In one or another exemplary embodiment, the gas containing an oxygen atom, a hydrogen atom, and a second halogen atom may be a gas including a molecule containing an oxygen atom, a hydrogen atom, and a second halogen atom.

In one or another exemplary embodiment, the second halogen atom may have an atomic radius smaller than an interstitial distance of a silicon crystal. In this case, the radical of the second halogen atom can enter into the silicon crystal from the surface of the silicon film.

According to yet another exemplary embodiment, a plasma treatment device is provided. The plasma treatment device includes a treatment vessel that is provided for defining a treatment space in which plasma is generated, a gas supply unit that supplies a treatment gas into the treatment space, a plasma generation source that generates the plasma of a gas supplied into the treatment vessel, and a controller that controls the gas supply unit and the plasma generation source. The controller is configured to perform etching the silicon film using the mask by plasma of a gas containing a first halogen atom, modifying a surface of the silicon film into an oxide layer by plasma of a gas containing an oxygen atom, a hydrogen atom, and a second halogen atom, the oxide layer including a first region extending along a side wall surface of the mask and a second region extending on the silicon film, etching the oxide layer to remove the second region while leaving the first region, and etching the silicon film using the mask and the oxide layer including the first region by plasma of a gas containing a third halogen atom.

According to yet another exemplary embodiment, a plasma treatment device is provided. The plasma treatment device includes a treatment vessel that is provided for defining a treatment space in which plasma is generated, a gas supply unit that supplies a treatment gas into the treatment space, a plasma generation source that generates the plasma of a gas supplied into the treatment vessel, and a controller that controls the gas supply unit and the plasma generation source. The controller includes etching the silicon film using the mask by plasma of a gas containing a first halogen atom, modifying a first region extending along a side wall surface of the mask in the surface of the silicon film into an oxide layer by plasma of a gas containing an oxygen atom, a hydrogen atom, and a second halogen atom, and etching the silicon film using the mask and the oxide layer including the first region by plasma of a gas containing a third halogen atom.

In yet another exemplary embodiment, in the modifying the first region into the oxide layer, bias power may be applied to the workpiece.

According to yet another exemplary embodiment described above, the same effect as that in the one or another exemplary embodiment is exhibited.

Hereinafter, various exemplary embodiments will be described in detail with reference to the drawings. In the drawings, the same or corresponding portions are denoted by the same reference signs.

(Outline of Etching Method)

FIG. 1 is a flowchart illustrating an etching method according to one exemplary embodiment. The etching method illustrated in FIG. 1 (referred to as "a method MT" below) is performed to etch a silicon film. The silicon film is a film formed of silicon (Si). The silicon may be amorphous silicon. Silicon may be single crystal silicon or polycrystalline silicon.

Figure 2:
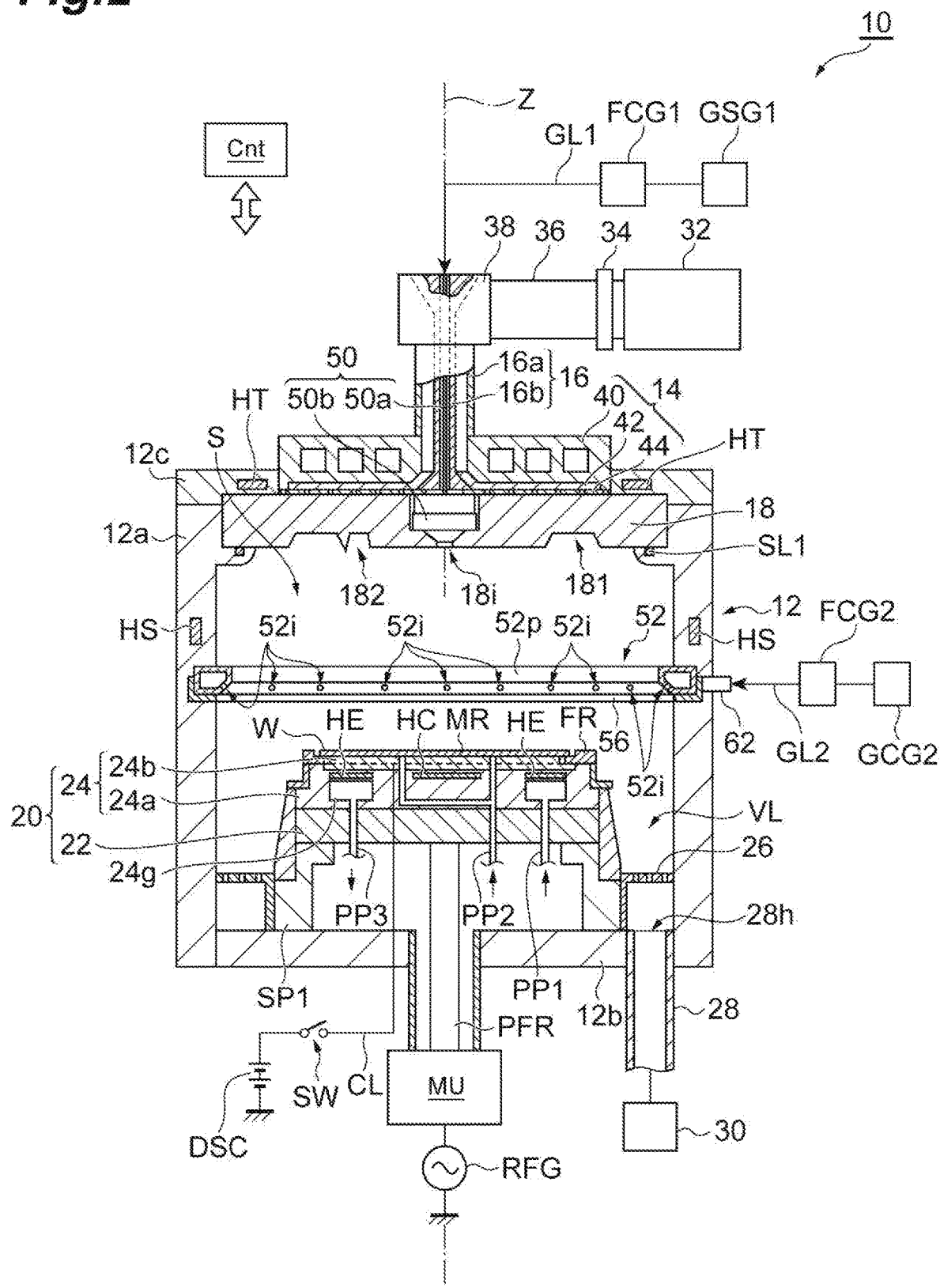
FIG. 2 is a diagram illustrating a plasma treatment device allowed to be used for performing the etching method illustrated in FIG. 1.

A plasma treatment device is used for performing the method MT. FIG. 2 is a schematic diagram illustrating an example of the plasma treatment device allowed to be used for performing the method MT. As illustrated in FIG. 2, a plasma treatment device 10 includes a treatment vessel 12. The treatment vessel 12 defines a treatment space. S for accommodating a workpiece W (wafer). The treatment vessel 12 may include a side wall 12a, a bottom portion 12b, and a top portion 12c.

The side wall 12a has a substantially cylindrical shape extending in a direction in which an axis Z extends (referred to as "an axis Z direction" below). The inner diameter of the side wall 12a is, for example, 540 mm. The bottom portion 12b is provided on the lower end side of the side wall 12a. The upper end portion of the side wall 12a is open. An opening at the upper end portion of the side wall 12a is closed by a dielectric window 18. The dielectric window 18 is sandwiched between the upper end portion of the side wall 12a and the top portion 12c. A sealing member SL1 may be interposed between the dielectric window 18 and the upper end portion of the side wall 12a. The sealing member SL1 is, for example, an O-ring, and contributes to air-tightness of the treatment vessel 12.

The plasma treatment device 10 further includes a mounting stand 20. The mounting stand 20 is provided in the treatment vessel 12 and below the dielectric window 18. The mounting stand 20 includes a plate 22 and an electrostatic chuck 24.

The plate 22 is a substantially disk-shaped metal member, and is made of, for example, aluminum. The plate 22 is supported by a cylindrical support portion SP1. The support portion SP1 extends vertically upward from the bottom portion 12b. The plate 22 also serves as a radio frequency electrode. The plate 22 is electrically connected to a radio frequency power source RFG that generates radio frequency bias power, through a matching unit MU and a power feeding rod PFR. The radio frequency power source RFG outputs bias power at a predetet mined frequency suitable for controlling the energy of ions drawn into the workpiece W, for example, 13.56 MHz. The radio frequency power source RFG is configured to be capable of outputting pulse-modulated bias power by repeating power ON and power OFF. The frequency of the pulse modulation may be variable, for example, in the range of 10 to 250 Hz. The ratio (duty ratio) of the power-ON time to the time of one cycle at the frequency of the pulse modulation may be variable. The matching unit MU accommodates a matching device for matching between the impedance on the radio frequency power source RFG side and the impedance on the load side such as an electrode, plasma, and the treatment vessel 12. The matching device includes a blocking capacitor for generating a self-bias.

The electrostatic chuck 24 is provided on the upper surface of the plate 22. The electrostatic chuck 24 includes a base plate 24a and a chuck portion 24b. The base plate 24a is a substantially disk-shaped metal member, and is made of, for example, aluminum. The base plate 24a is provided on the plate 22. The chuck portion 24b is provided on the upper surface of the base plate 24a. The upper surface of the chuck portion 24b serves as a mounting region MR for mounting the workpiece W. The chuck portion 24b holds the workpiece W with an electrostatic attraction force. The chuck portion 24b includes an electrode film interposed between dielectric films. A DC power source DSC is electrically connected to the electrode film of the chuck portion 24b through a switch SW and a coated wire CL. The chuck portion 24b can attract and hold the workpiece W on the upper surface of the chuck portion by a Coulomb force generated by a DC voltage applied from the DC power source DSC. A focus ring FR surrounding the edge of the workpiece W in a ring shape is provided radially outside the chuck portion 24b.

An annular cooling chamber 24g extending in a circumferential direction is provided in the base plate 24a. A coolant (for example, cooling water) at a predetermined temperature is circulated and supplied to the cooling chamber 24g from a chiller unit through pipes PP1 and PP3. The treatment temperature of the workpiece W on the chuck portion 24b may be controlled by the temperature of the coolant. A heat transfer gas, for example, a He gas, from a heat-transfer gas supply unit is supplied between the upper surface of the chuck portion 24b and the back surface of the workpiece W through a supply pipe PP2.

An annular exhaust path VL is provided around the mounting stand 20. An annular baffle plate 26 in which a plurality of through-holes are formed is provided in the middle of the exhaust path VL in the axis Z direction. The exhaust path VL is connected to an exhaust pipe 28 that provides an exhaust port 28h. The exhaust pipe 28 is attached to the bottom portion 12b of the treatment vessel 12. An exhaust device 30 is connected to the exhaust pipe 28. The exhaust device 30 has a pressure regulator and a vacuum pump such as a turbo molecular pump. It is possible to reduce the pressure of the treatment space S in the treatment vessel 12 up to a desired degree of vacuum by the exhaust device 30. The gas can be exhausted from the outer periphery of the mounting stand 20 through the exhaust path VL, by operating the exhaust device 30.

The plasma treatment device 10 may further include heaters HT, HS, HC, and HE as a temperature control mechanism. The heater HT is provided in the top portion 12c and extends annularly to surround an antenna 14. The heater HS is provided in the side wall 12a and extends annularly. The heater HC is provided in the base plate 24a. The heater HC is provided below the central portion of the mounting region MR, that is, in a region intersecting with the axis Z, in the base plate 24a. The heater HE is provided in the base plate 24a and extends annularly to surround the heater HC. The heater HE is provided below the outer edge portion of the above-described mounting region MR.

The plasma treatment device 10 may further include the antenna 14, a coaxial waveguide 16, a dielectric window 18, a microwave generator 32, a tuner 34, a waveguide 36, and a mode converter 38. The microwave generator 32 generates a microwave having a frequency of, for example, 2.45 GHz. The microwave generator 32 is connected to the upper portion of the coaxial waveguide 16 through the tuner 34, the waveguide 36, and the mode converter 38. The coaxial waveguide 16 extends in the axis Z being the center axis of the coaxial waveguide. In one exemplary embodiment, the center of the mounting region MR of the mounting stand 20 is located on the axis Z.

The coaxial waveguide 16 includes an outer conductor 16a and an inner conductor 16b. The outer conductor 16a has a cylindrical shape extending around the center of the axis Z. The lower end of the outer conductor 16a may be electrically connected to the upper portion of a cooling jacket 40 having a conductive surface. The inner conductor 16b is provided coaxially with the outer conductor 16a inside the outer conductor 16a. The inner conductor 16b has a cylindrical shape extending around the center of the axis Z. The lower end of the inner conductor 16b is connected to a slot plate 44 of the antenna 14.

In one exemplary embodiment, the antenna 14 is a radial line slot antenna. The antenna 14 is disposed in an opening formed at the top portion 12c, and is provided on the upper surface of the dielectric window 18. The antenna 14 includes a dielectric plate 42 and the slot plate 44. The dielectric plate 42 shortens the wavelength of the microwave, and has a substantially disk shape. The dielectric plate 42 is made of, for example, quartz or alumina. The dielectric plate 42 is sandwiched between the slot plate 44 and the lower surface of the cooling jacket 40. Thus, the antenna 14 may be constituted by the dielectric plate 42, the slot plate 44, and the lower surface of the cooling jacket 40.

The slot plate 44 has a thin plate shape and a disk shape. Both surfaces of the slot plate 44 in a plate thickness direction are flat. The center of the circular slot plate 44 is located on the axis Z. A plurality of slot pairs are provided in the slot plate 44. Each of the plurality of slot pairs includes two slot holes penetrating in the plate thickness direction. The planar shape of each slot hole is a long hole shape. In each slot pair, a direction in which a major axis of the slot hole extends intersects or is orthogonal to a direction in which the major axis of the slot hole extends.

The dielectric window 18 has a substantially disk shape and is made of a dielectric substance such as quartz or alumina. The slot plate 44 is provided on the upper surface of the dielectric window 18.

A through-hole is formed at the center of the dielectric window 18. The upper portion of the through-hole serves as a space for accommodating an injector 50b of a central introduction unit 50 described later, and the lower portion of the through-hole serves as a central introduction port 18i of the central introduction unit 50 described later. The center axis of the dielectric window 18 coincides with the axis Z.

The lower surface of the dielectric window is in contact with the treatment space S and serves as a surface on which plasma is generated. Various shapes are defined for the lower surface 18b. Specifically, the lower surface has a flat surface in a central region surrounding the central introduction port 18i. The flat surface is orthogonal to the axis Z. The lower surface defines an annular first recess portion 181 that extends in an annular shape and is tapered inward in the plate thickness direction of the dielectric window 18, in a radially outer region of the flat surface. The lower surface defines a plurality of second recess portions 182 recessed from the flat surface inward in the plate thickness direction.

In the plasma treatment device 10, a microwave generated by the microwave generator 32 passes through the coaxial waveguide 16, propagates in the dielectric plate 42, and is applied to the dielectric window 18 from slot holes 44a and 44b of the slot plate 44.

In the dielectric window 18, the plate thickness of a portion defining the first recess portion 181 and the plate thickness of a portion defining the second recess portion 182 are smaller than those of other portions. Thus, in the dielectric window 18, the portion defining the first recess portion 181 and the portion defining the second recess portion 182 have improved microwave permeability. The microwave electric field concentrates on the first recess portion 181 and the second recess portion 182, and the microwave energy concentrates on the first recess portion 181 and the second recess portion 182. As a result, it is possible to stably generate plasma at the first recess portion 181 and the second recess portion 182, and to stably generate plasma distributed immediately below the dielectric window 18 in a radial direction and the circumferential direction.

The plasma treatment device 10 includes the central introduction unit 50 and a peripheral introduction portion 52. The central introduction unit 50 includes a conduit 50a, the injector 50b, and the central introduction port 18i. The conduit 50a passes through an inner hole of the inner conductor 16b of the coaxial waveguide 16. The end portion of the conduit 50a extends into a space defined by the dielectric window 18 along the axis Z. The injector 50b is accommodated in the space and below the end portion of the conduit 50a. A plurality of through-holes extending in the axis Z direction are provided in the injector 50b. The dielectric window 18 defines the central introduction port 18i. The central introduction port 18i is continuous with the lower portion of the space 18s and extends along the axis Z. The central introduction unit 50 having such a configuration supplies a gas to the injector 50b through the conduit 50a, and injects the gas from the injector 50b through the central introduction port 18i. As described above, the central introduction unit 50 injects a gas to the immediately downward side of the dielectric window 18 along the axis Z. That is, the central introduction unit 50 introduces a gas into a plasma generation region in which an electron temperature is high.

The peripheral introduction portion 52 includes a plurality of peripheral introduction ports 52i. The plurality of peripheral introduction ports 52i are mainly used for supplying a gas to the edge region of the workpiece W. The plurality of peripheral introduction ports 52i are open toward the edge region of the workpiece W or the edge portion of the mounting region MR. The plurality of peripheral introduction ports 52i are arranged in the circumferential direction below the central introduction port 18i and above the mounting stand 20. That is, the plurality of peripheral introduction ports 52i are arranged annularly around the axis Z in a region (plasma diffusion region) in which the electron temperature is lower than that in a region just below the dielectric window. The peripheral introduction portion 52 is used for supplying the gas from the region having a low electron temperature to the workpiece W. Thus, the dissociation degree of the gas introduced from the peripheral introduction portion 52 into the treatment space S is reduced in comparison to the dissociation degree of the gas supplied from the central introduction unit 50 into the treatment space S.

A first gas source group GSG1 is connected to the central introduction unit 50 through a first flow rate control unit group FCG1. In addition, a second gas source group GSG2 is connected to the peripheral introduction portion 52 via a second flow rate control unit group FCG2.

The first gas source group GSG1 includes a plurality of first gas sources. The plurality of first gas sources may include a source of an argon gas and a source of a helium (He) gas. The plurality of first gas sources may include a source of a gas containing an oxygen atom. An example of the gas containing an oxygen atom is an oxygen gas, a carbon monoxide (CO) gas, a carbon dioxide ($CO_2$) gas, or an ozone ($O_3$) gas. The plurality of first gas sources may include a source of a gas containing a hydrogen atom. An example of the gas containing a hydrogen atom is a hydrogen gas or a hydrocarbon-based gas ($CH_4$, $C_2H_6$, $C_2H_4$, or the like).

The plurality of first gas sources may include a source of a gas containing a first halogen atom. The first halogen atom is not particularly limited as long as the atom is a halogen atom. An example of the first halogen atom is fluorine (F), chlorine (Cl), or bromine (Br). An example of the gas containing a first halogen atom is a fluorocarbon ($CF_4$) gas, a chlorine ($Cl_2$) gas, or a hydrogen bromide (HBr) gas.

The plurality of first gas sources may include a source of a gas containing a second halogen atom. The second halogen atom is not particularly limited as long as the atom is a halogen atom. The second halogen atom may have an atomic radius smaller than an interstitial distance of a silicon crystal. An example of the second halogen atom is fluorine (F). An example of the gas containing a second halogen atom is a nitrogen fluoride ($NF_3$) gas, a carbon fluoride gas, a fluorine gas ($F_2$), or a xenon fluoride ($XeF_2$).

The plurality of first gas sources may include a source of a gas containing a third halogen atom. The third halogen atom is not particularly limited as long as the atom is a halogen atom. An example of the third halogen atom is fluorine, chlorine, or bromine. An example of the gas containing a third halogen atom is a fluorocarbon gas, a chlorine gas, a hydrogen bromide gas, or a fluoromethane gas.

The plurality of first gas sources may include a source of a gas containing a hydrogen atom and the second halogen atom. An example of the gas containing a hydrogen atom and the second halogen atom is a hydrofluorocarbon ($C_xH_yF_z$) gas. x, y, z may be an integer of 1 or more. y may be greater than z. An example of such a gas is a fluoromethane ($CH_3F$) gas or a $C_2H_4F_2$ gas.

The plurality of first gas sources may include a source of a gas including a molecule containing an oxygen atom, a hydrogen atom, and the second halogen atom. An example of the molecule containing an oxygen atom, a hydrogen atom, and the second halogen atom is $C_xH_yF_zO$. x, y, z may be an integer of 1 or more.

The first gas source group GSG1 may further include a source of a gas different from the above-described gases.

The first flow rate control unit group FCG1 includes a valve and a flow rate controller. The flow rate controller is, for example, a mass flow rate controller. Each of the plurality of first gas sources is connected to a common gas line GL1 via the valve and the flow rate controller. The common gas line GL1 is connected to the central introduction unit 50.

The second gas source group GSG2 includes a plurality of second gas sources. The second gas source may include a source of the gas exemplified in the first gas source. The second gas source group GSG2 may further include a source of a gas different from the gas in the first gas source.

The second flow rate control unit group FCG2 includes a valve and a flow rate controller. The flow rate controller is, for example, a mass flow rate controller. Each of the plurality of second gas sources is connected to a common gas line GL2 via the valve and the flow rate controller. The common gas line GL2 is connected to the peripheral introduction portion 52.

As described above, in the plasma treatment device 10, the plurality of first gas sources and the plurality of first flow rate control units are provided exclusively for the central introduction unit 50. The plurality of second gas sources and the plurality of second flow rate control units which are independent from the plurality of first gas sources and the plurality of first flow rate control units are provided exclusively for the peripheral introduction portion 52. Thus, the type of gas introduced into the treatment space S from the central introduction unit 50 and the flow rates of one or more gases introduced from the central introduction unit 50 into the treatment space S can be independently controlled. In addition, the type of gas introduced into the treatment space S from the peripheral introduction portion 52 and the flow rates of one or more gases introduced into the treatment space S from the peripheral introduction portion 52 can be independently controlled.

In one exemplary embodiment, the plasma treatment device 10 may further include a control unit (example of a controller) Cnt, as illustrated in FIG. 2. The control unit Cnt may be a controller such as a programmable computer device. The control unit Cnt may control each unit of the plasma treatment device 10 in accordance with a program based on a recipe. For example, the control unit Cnt can transmit a control signal to the plurality of first flow rate control unit groups FCG1 so as to adjust the type of gas and the flow rate of the gas supplied to the central introduction unit 50. The control unit Cnt can transmit a control signal to the plurality of second flow rate control unit groups FCG2 so as to adjust the type of gas and the flow rate of the gas supplied to the peripheral introduction portion 52. The control unit Cnt may supply control signals to the microwave generator 32, the radio frequency power source RFG, and the exhaust device 30 so as to control the power of the microwave, the power and ON/OFF of the RF bias, and the pressure in the treatment vessel 12. Further, the control unit Cnt may transmit a control signal to a heater power source connected to the heaters HT, HS, HC, and HE in order to adjust the temperature of the heaters.

In one exemplary embodiment, the control unit Cnt may adjust the ON/OFF ratio of the RF bias power to generate pulse-like RF bias power. In a case where an OFF time of the RF bias power is not provided, a constant bias voltage is continuously applied without depending on time. In a case where the bias voltage is applied in a pulse form, a constant bias voltage is applied only during the ON time. That is, etching is performed by drawing ions into the wafer only during the ON time. During the OFF time, the bias power becomes 0. That is, during the OFF time, etching is not performed, and the by-product generated by the etching is exhausted. The RF bias power is pulse-modulated by repeating the above ON time and OFF time.

The pulse-modulated bias power has a cycle configured with one ON time and one OFF time which is continuous with the ON time. Here, the ratio of the ON time to the cycle is referred to as a duty ratio. The control unit Cnt may perform pulse modulation, for example, such that the duty ratio becomes equal to or smaller than 50%. In a case where the duty ratio is 0, etching is not performed. Therefore, the control unit Cnt may perform pulse modulation, for example, such that the duty ratio is greater than 0%. Alternatively, the control unit Cnt may perform pulse modulation such that the duty ratio becomes within a range of 5% or more and 50% or less, for example. When the duty ratio is 100%, a continuous bias voltage is obtained.

In one exemplary embodiment, the peripheral introduction portion 52 further includes an annular tube 52p. The plurality of peripheral introduction ports 52i are formed in the tube 52p. The annular tube 52p may be made of, for example, quartz. As illustrated in FIG. 2, the annular tube 52p is provided along the inner wall surface of the side wall 12a in one exemplary embodiment. In other words, the annular tube 52p is not disposed on a path connecting the lower surface of the dielectric window 18 and the mounting region MR, that is, the workpiece W. Thus, the annular tube 52p does not hinder the diffusion of the plasma. Since the annular tube 52p is provided along the inner wall surface of the side wall 12a, the consumption of the annular tube 52p by plasma is suppressed, and thus it is possible to reduce the replacement frequency of the annular tube 52p. Further, since the annular tube 52p is provided along the side wall 12a having a temperature which may be controlled by the heater, it is possible to improve the stability of the temperature of the gas introduced from the peripheral introduction portion 52 into the treatment space S.

In one exemplary embodiment, the plurality of peripheral introduction ports 52i are open toward the edge region of the workpiece W. That is, the plurality of peripheral introduction ports 52i are inclined from a plane orthogonal to the axis Z so as to inject the gas toward the edge region of the workpiece W. As described above, since the peripheral introduction port 52i is opened to be inclined toward the edge region of the workpiece W, the active species of the gas injected from the peripheral introduction port 52i directly travel into the edge region of the workpiece W. Thus, it is possible to supply the active species of the gas to the edge of the workpiece W without deactivating the active species. As a result, it is possible to reduce the variation in the treatment speed of each region of the workpiece W in the radial direction.

Figure 3:
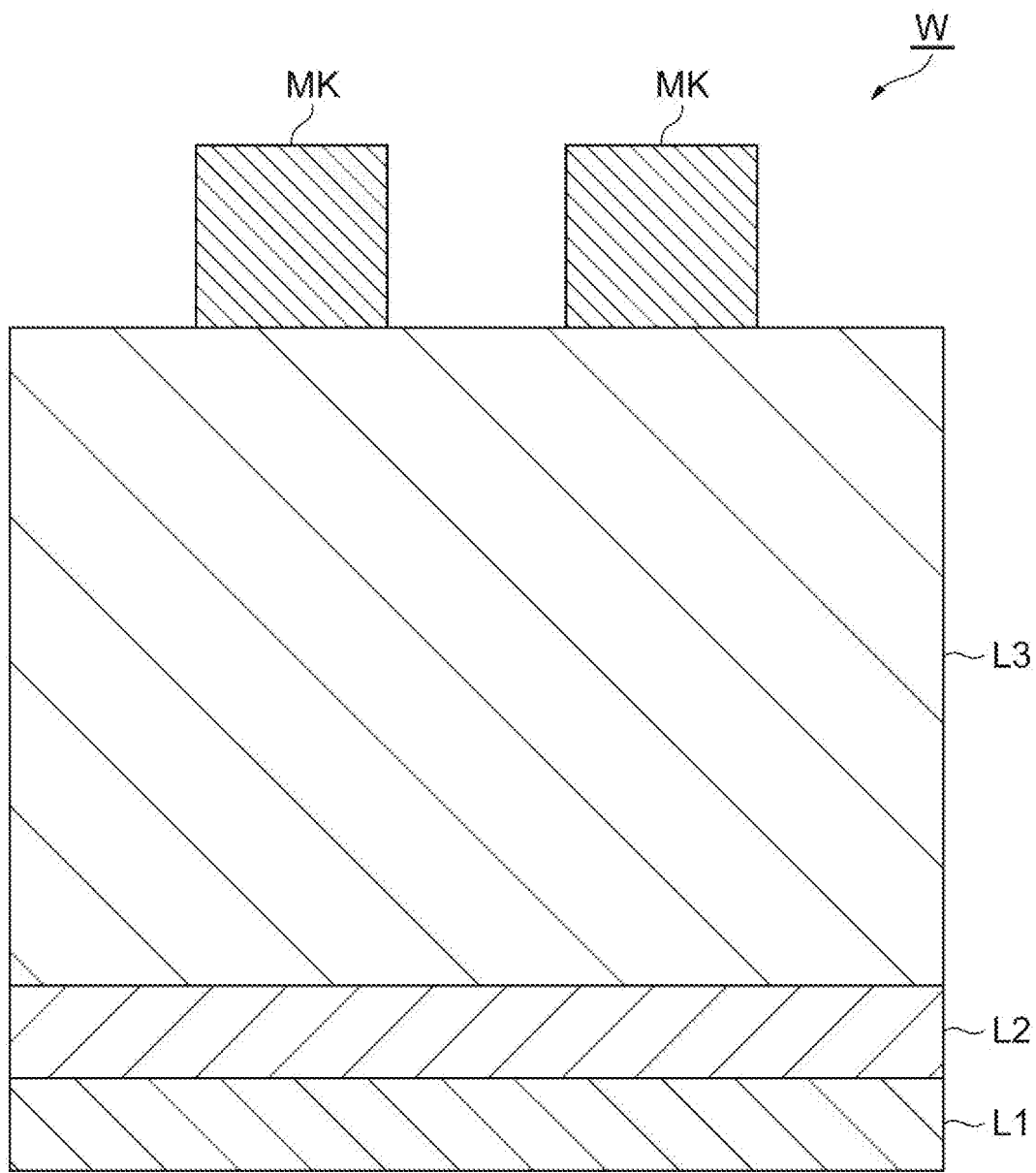
FIG. 3 is a sectional view illustrating an example of a workpiece to which the etching method illustrated in FIG. 1 may be applied.

FIG. 3 is a sectional view illustrating an example of a workpiece to which the method MT may be applied. The workpiece W illustrated in FIG. 3 includes a substrate L1, a silicon oxide film L2, a silicon film L3, and a mask MK. The silicon film L3 is a film as a target of etching.

The substrate L1 is formed of, for example, silicon. The silicon oxide film L2 is provided on the substrate L1. An example of the thickness of the silicon oxide film L2 is 30 nm. The silicon film L3 is provided on the silicon oxide film L2. An example of the thickness of the silicon film L3 is 150 nm. The mask MK is formed of a material allowed to secure a selection ratio to the silicon film L3. An example of the material is silicon nitride. An example of the thickness of the mask MK is 50 nm. The configuration and the material of the workpiece W illustrated in FIG. 3, and the thickness of each of the above-described layers of the workpiece W are examples, and an application target of the method MT is not limited to the workpiece W illustrated in FIG. 2.

The method MT will be described below in detail with reference to FIG. 1 again. Here, an example in which the workpiece W illustrated in FIG. 3 is etched using the plasma treatment device 10 illustrated in FIG. 2 will be described. As illustrated in FIG. 1, the method MT includes a preparation step (S10), a removal step (S12), a first etching step (S14), a protective film forming step (S16), a protective film etching step (S18), and a second etching step (S20).

In the preparation step (S10), the control unit Cnt prepares a workpiece W. The control unit Cnt places the workpiece W in the treatment vessel 12 of the plasma treatment device 10, that is, in the treatment space S. In the treatment space S, the workpiece W is mounted on the mounting stand 20.

In the removal step (S12), the control unit Cnt removes the natural oxide film formed on the surface layer of the workpiece W by plasma etching. An example of an etching gas is a fluorocarbon gas. In the removal step (S12), as an example, a mixed gas of an argon gas and a fluorocarbon gas is supplied from the central introduction unit 50 and the peripheral introduction portion 52. Then, plasma is generated by microwaves generated by the microwave generator 32. The control unit Cnt turns ON the RF bias power for the workpiece W. The etching gas is not limited to the above-described gas so long as the gas is capable of removing the silicon oxide film.

Figure 4:
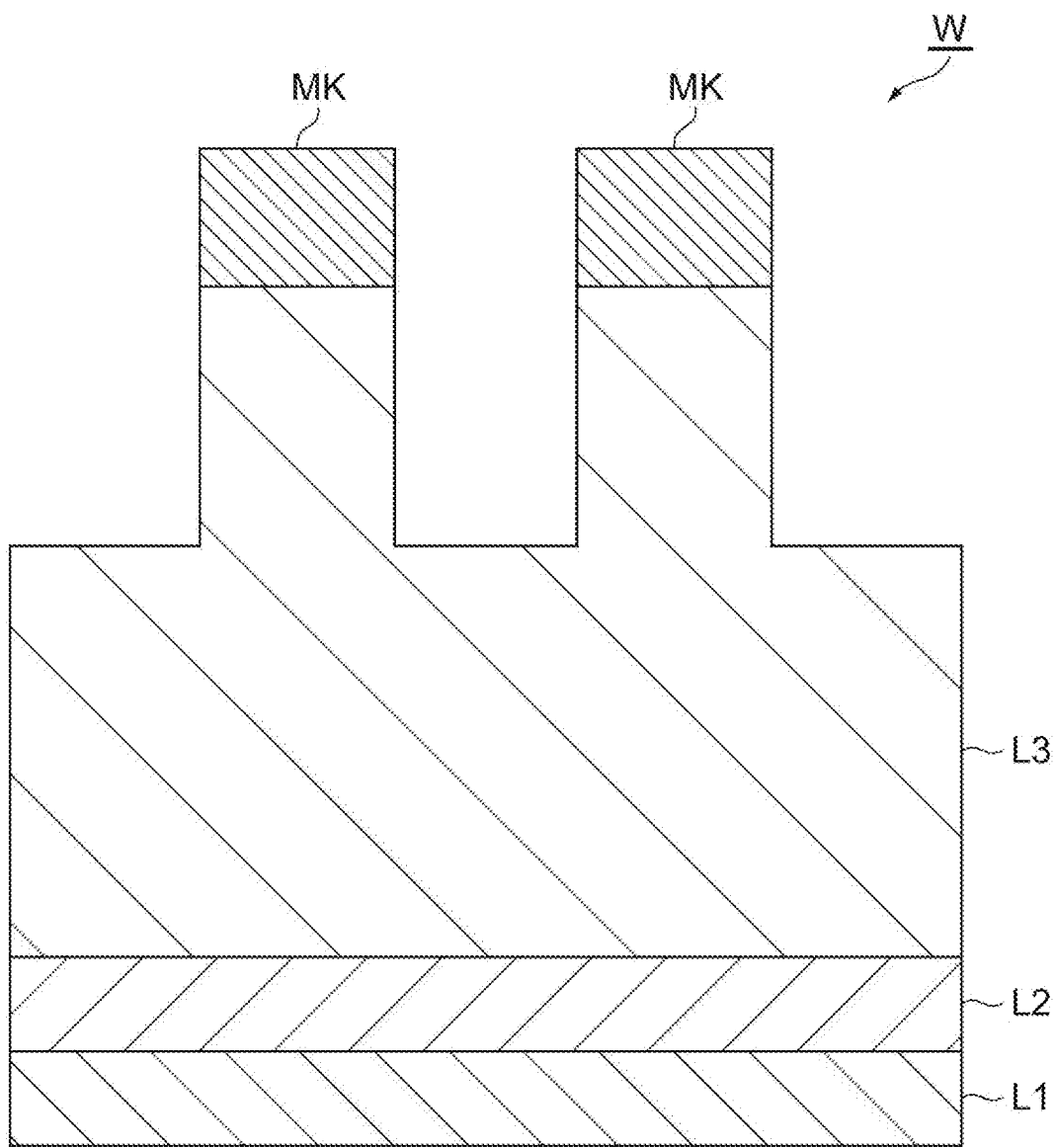
FIG. 4 is a sectional view illustrating an example of the workpiece after a first etching step is performed.

In the first etching step (S14), the control unit Cnt etches the silicon film L3 using the mask MK by plasma of a gas containing a first halogen atom. An example of the first halogen atom is fluorine, chlorine, or bromine. An example of the etching gas is a fluorocarbon gas, a chlorine gas, or a hydrogen bromide gas. In the first etching step (S14), as an example, a mixed gas of an argon gas, a chlorine gas, and an oxygen gas is supplied from the central introduction unit 50 and the peripheral introduction portion 52. Then, plasma is generated by microwaves generated by the microwave generator 32. The control unit Cnt turns ON the RF bias power for the workpiece W. The control unit Cnt controls the gas flow rate and the etching time such that a predetermined amount of the silicon film L3 is etched. The predetermined amount of the silicon film L3 means, for example, 10% to 90% of the thickness of the silicon film L3. FIG. 4 is a sectional view illustrating an example of the workpiece after a first etching step is performed. As illustrated in FIG. 4, a recess portion is formed in the silicon film L3, and the etching of the silicon film L3 is temporarily stopped in the middle of etching.

In the protective film forming step (S16), the control unit Cnt causes the surface of the silicon film L3 to be modified into an oxide layer by plasma of a gas containing an oxygen atom, a hydrogen atom, and a second halogen atom. An example of the second halogen atom is fluorine.

The gas containing the oxygen atom, the hydrogen atom, and the second halogen atom may be a mixed gas of a gas containing an oxygen atom and a gas containing a hydrogen atom and a second halogen atom. An example of the gas containing an oxygen atom is an oxygen gas, a carbon monoxide gas, a carbon dioxide gas, or an ozone gas. An example of the gas containing a hydrogen atom and the second halogen atom is a hydrofluorocarbon ($C_xH_yF_z$) gas. x, y, z may be an integer of 1 or more. y may be greater than z. An example of such a gas is a fluoromethane ($CH_3F$) gas or a $C_2H_4F_2$ gas. If the amount of the gas containing the oxygen atom is set to 1, the ratio of the hydrofluorocarbon gas to the gas containing the oxygen atom is in the range of 0.3 to 1.8.

The gas containing the oxygen atom, the hydrogen atom, and the second halogen atom may be a mixed gas of a gas containing an oxygen atom, and a gas containing a hydrogen atom, a gas containing a second halogen atom. An example of the gas containing an oxygen atom is an oxygen gas, a carbon monoxide gas, a carbon dioxide gas, or an ozone gas. An example of the gas containing a hydrogen atom is a hydrogen gas or a hydrocarbon-based gas ($CH_4$, $C_2H_6$, $C_2H_4$, or the like). An example of the gas containing the second halogen atom is a nitrogen fluoride gas or a carbon fluoride gas.

The gas containing an oxygen atom, a hydrogen atom, and a second halogen atom may be a gas including a molecule containing an oxygen atom, a hydrogen atom, and a second halogen atom. An example of the gas including a molecule containing the oxygen atom, the hydrogen atom, and the second halogen atom is a $C_xH_yF_zO$ gas. x, y, z may be an integer of 1 or more.

In the protective film forming step (S16), as an example, a mixed gas of a helium (He) gas, an oxygen gas, and a fluoromethane gas is supplied from the central introduction unit 50 and the peripheral introduction portion 52. Then, plasma is generated by microwaves generated by the microwave generator 32. Thus, the surface of the silicon film L3 is modified into the oxide layer.

Figure 5:
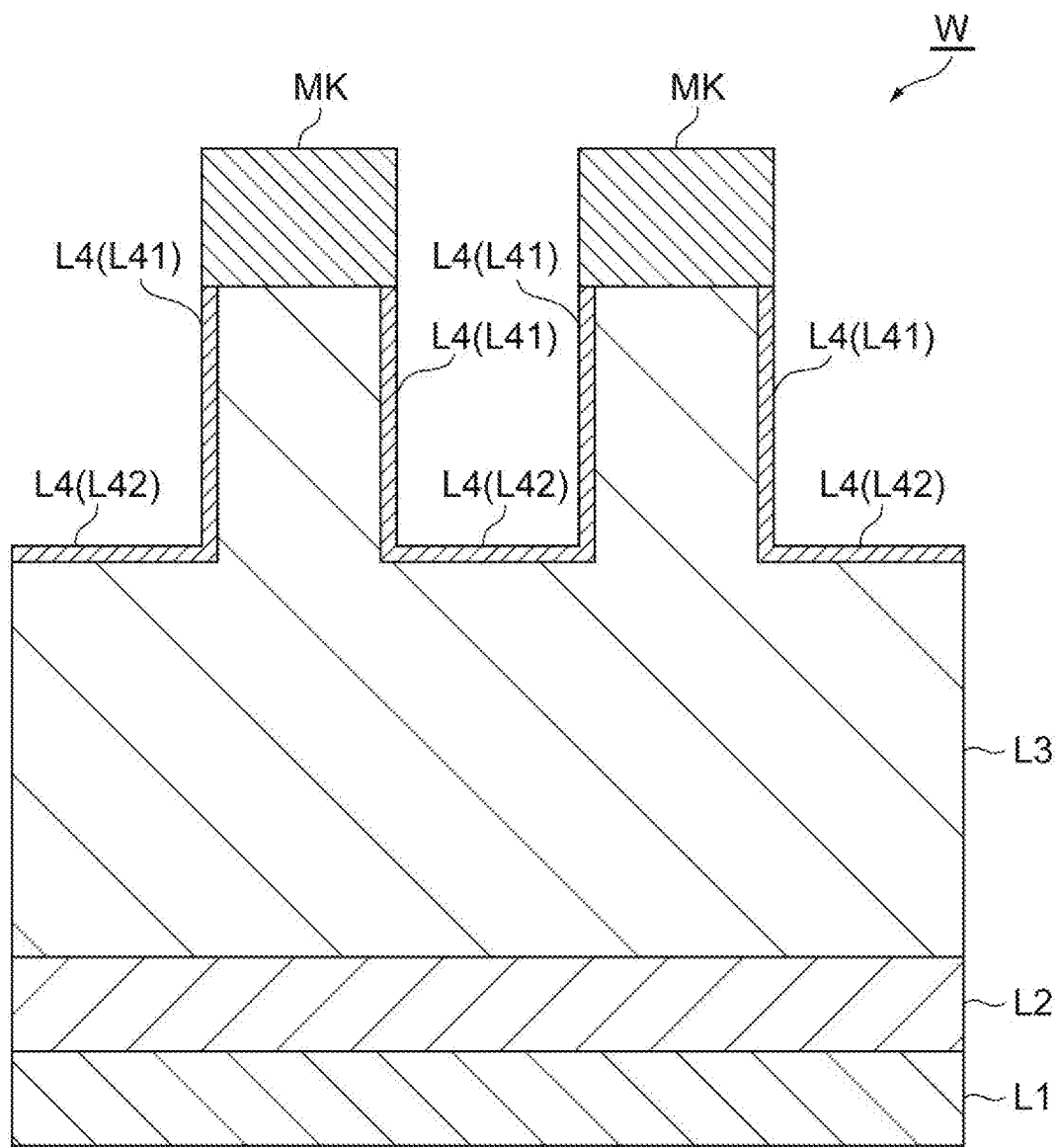
FIG. 5 is a sectional view illustrating an example of the workpiece after a protective film forming step is performed.

FIG. 5 is a sectional view illustrating an example of the workpiece after a protective film forming step is performed. As illustrated in FIG. 5, the surface of the silicon film L3 is modified by the plasma of the above-described gas, and thereby an oxide layer L4 is fainted. The oxide layer L4 includes a first region L41 extending along the side wall surface of the mask MK and a second region L42 extending on the silicon film L3.

In the protective film forming step (S16), the control unit Cnt may turn OFF the RF bias power for the workpiece W. Thus, since no ions are drawn into the workpiece W, it is possible to reduce the anisotropy in the vertical direction and to easily form the first region L41. Since an isotropic protective film is formed, the first region L41 and the second region L42 have the same thin film thickness, and the second region L42 may be easily removed in the protective film etching step (S18) described later.

In the protective film forming step (S16), the control unit Cnt may turn ON the RF bias power for the workpiece W. Fluorocarbon ions ($CF^+$) generated from the plasma of fluoromethane gas are drawn into the workpiece W by the bias applied to the workpiece W. Therefore, the oxide layer on the surface of the silicon film L3, which has been modified by oxygen atoms is immediately etched by fluorocarbon ions ($CF^+$). Thus, after the protective film forming step (S16) is completed, the second region L42 of the oxide layer L4 is not formed. Accordingly, the protective film etching step (S18) described later can be omitted. In this case, the generation rate (modification rate) of the oxide layer on the surface of the silicon film L3, which is modified by oxygen atoms may be substantially equal to the etching rate of the oxide layer etched by drawing the fluorocarbon ions ($CF^+$). Alternatively, the etching rate may be slightly faster than the generation rate. The fluorocarbon ions ($CF^+$) drawn into the workpiece W by the bias applied to the workpiece W have anisotropy in the direction perpendicular to the workpiece W. Therefore, the oxide layer of the first region L41 extending along the side wall surface of the mask MK is generated without being etched.

In the protective film etching step (S18), the control unit Cnt etches the oxide layer L4 to remove the second region L42 while leaving the first region L41. An example of the etching gas is a mixed gas of a fluorocarbon gas and a chlorine gas. In the protective film etching step (S18), as an example, a mixed gas of an argon gas, a fluorocarbon gas, and a chlorine gas is supplied from the central introduction unit 50 and the peripheral introduction portion 52. Then, plasma is generated by microwaves generated by the microwave generator 32. The control unit Cnt turns ON the RF bias power for the workpiece W. The etching gas is not limited to the above-described gas so long as the gas is capable of removing the silicon oxide film.

Figure 6:
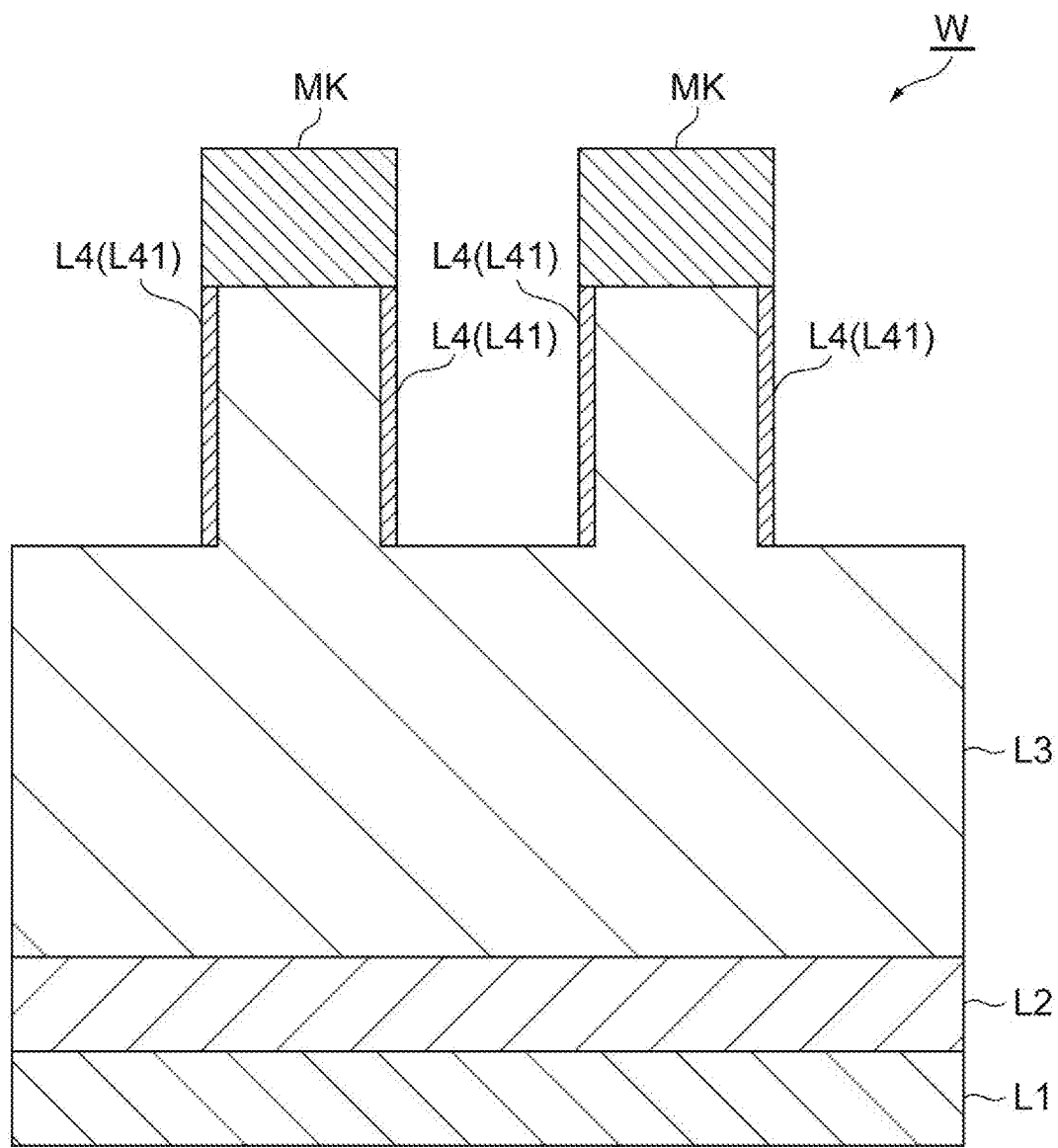
FIG. 6 is a sectional view illustrating an example of the workpiece after a protective film etching step is performed.

FIG. 6 is a sectional view illustrating an example of the workpiece after a protective film etching step is performed. As illustrated in FIG. 6, in the oxide layer L4, only the first region L41 remains, and the second region L42 is etched. Thus, the surface of the bottom portion of the recess portion formed in the silicon film L3 is exposed.

In the second etching step (S20), the control unit Cnt etches the silicon film L3 using the mask MK and the oxide layer L4 including the first region L41 by plasma of a gas containing a third halogen atom. An example of the third halogen atom is fluorine, chlorine, or bromine. An example of the etching gas is a fluorocarbon gas, a chlorine gas, a hydrogen bromide gas, or a fluoromethane gas. In the second etching step (S20), as an example, a mixed gas of a helium gas, a carbon dioxide gas, a chlorine gas, and a fluoromethane gas is supplied from the central introduction unit 50 and the peripheral introduction portion 52. Then, plasma is generated by microwaves generated by the microwave generator 32. The control unit Cnt turns ON the RF bias power for the workpiece W. The control unit Cnt may apply pulse-modulated bias power.

Figure 7:
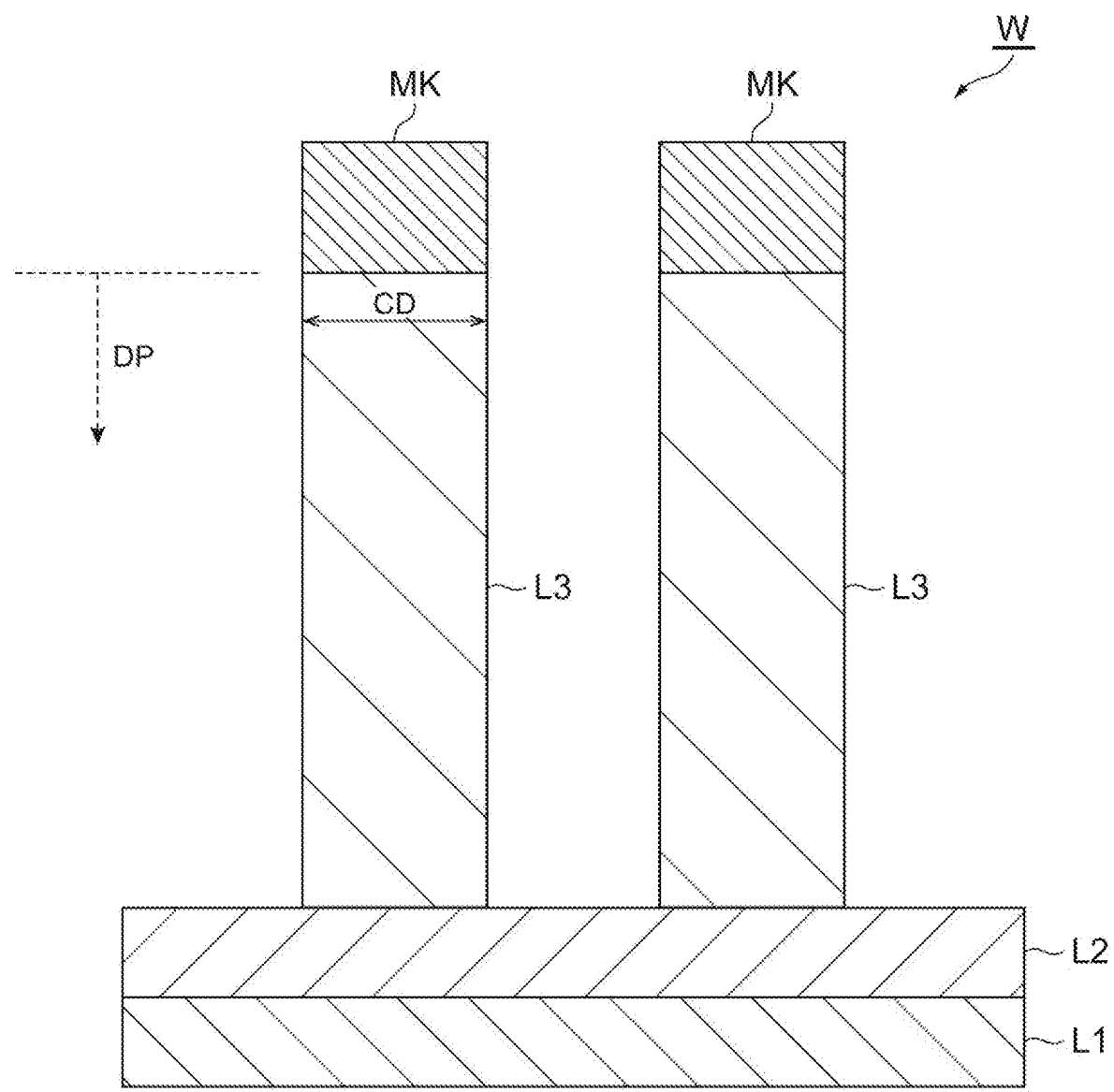
FIG. 7 is a sectional view illustrating an example of the workpiece after a second etching step is performed.

FIG. 7 is a sectional view illustrating an example of the workpiece after a second etching step is performed. As illustrated in FIG. 7, the silicon film L3 is etched in the vertical direction as designed. Since the sidewall protective film is formed, the bowing shape of the silicon film L3 is improved. In the following description, description will be made on the assumption that the depth from the mask MK is set as DP [nm], and the width of the silicon film L3 immediately below the mask MK is set as CD [nm].

In the method MT, the protective film forming step (S16), the protective film etching step (S18), and the second etching step (S20) may be repeated. Thus, the first region L41 of the oxide layer L4 can also be formed, as a protective film, on the surface of the recess portion of the silicon film L3, which has been further formed by the second etching step (S20), and accordingly, the bowing shape of the silicon film L3 is further improved.

The steps included in the method MT may be continuously performed in the same treatment vessel. Among the steps included in the method MT, only predetermined steps may be performed in another treatment vessel. In this case, the workpiece W may be transported between the treatment vessels in a consistent vacuum environment. If the workpiece W after the protective film etching step (S18) is exposed to the atmosphere instead of the consistent vacuum environment, a natural oxide film is formed on the surface of the bottom portion of the recess portion formed in the exposed silicon film L3. Therefore, when the second etching step (S20) is performed, it is necessary to remove the natural oxide film formed on the surface layer of the workpiece W again by plasma etching in a manner similar to the removal step (S12), and this leads to reduction in productivity. In the protective film forming step (S16) and the protective film etching step (S18), including halogen is provided as the gas conditions. Therefore, in a case where the workpiece W is exposed to the atmosphere after the protective film forming step (S16) and the protective film etching step (S18), residual halogen adhering to the workpiece W and moisture contained in the atmosphere may react with each other, and thus the workpiece W may be corroded. In this case, maintaining the width or the vertical shape of the silicon film L3 is not possible. In a case where the above steps are continuously performed in the same treatment vessel, the workpiece W is not exposed to the atmosphere. That is, it is possible to improve productivity and to obtain a desired etching shape, by continuously performing the steps included in the method MT in the same treatment vessel or in the consistent vacuum environment.

Figure 8:
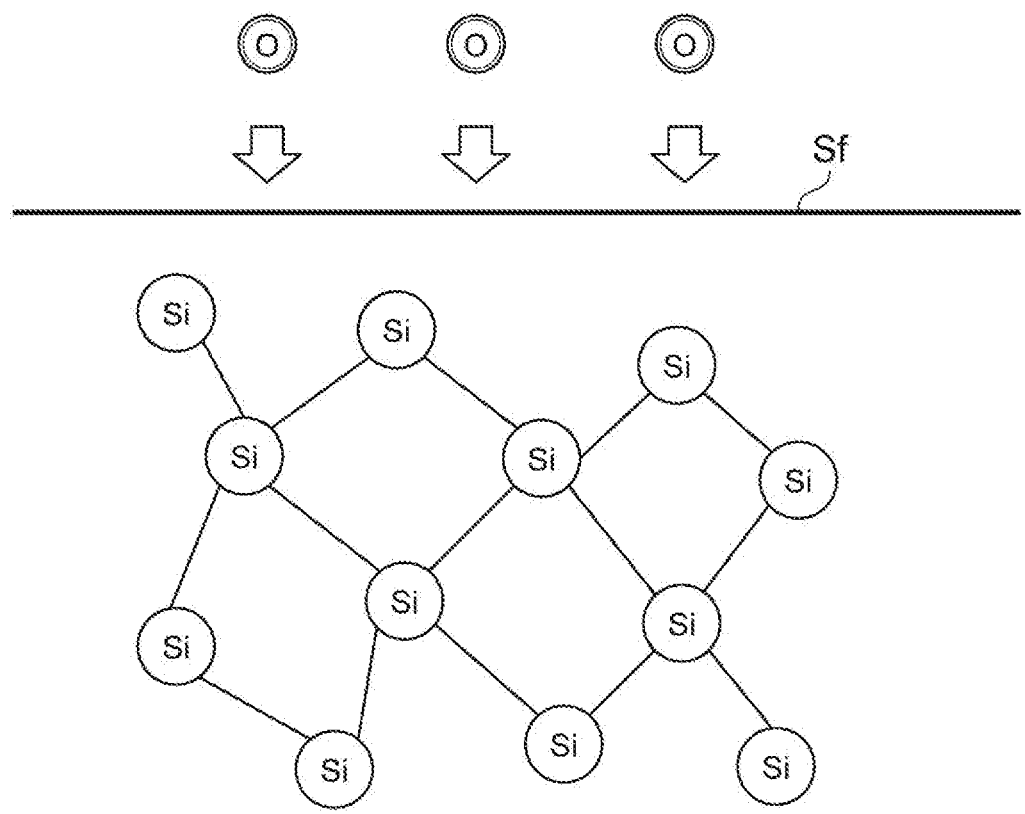
FIG. 8 is a diagram for explaining an oxidation principle of a silicon film using only an oxygen radical.
Figure 9:
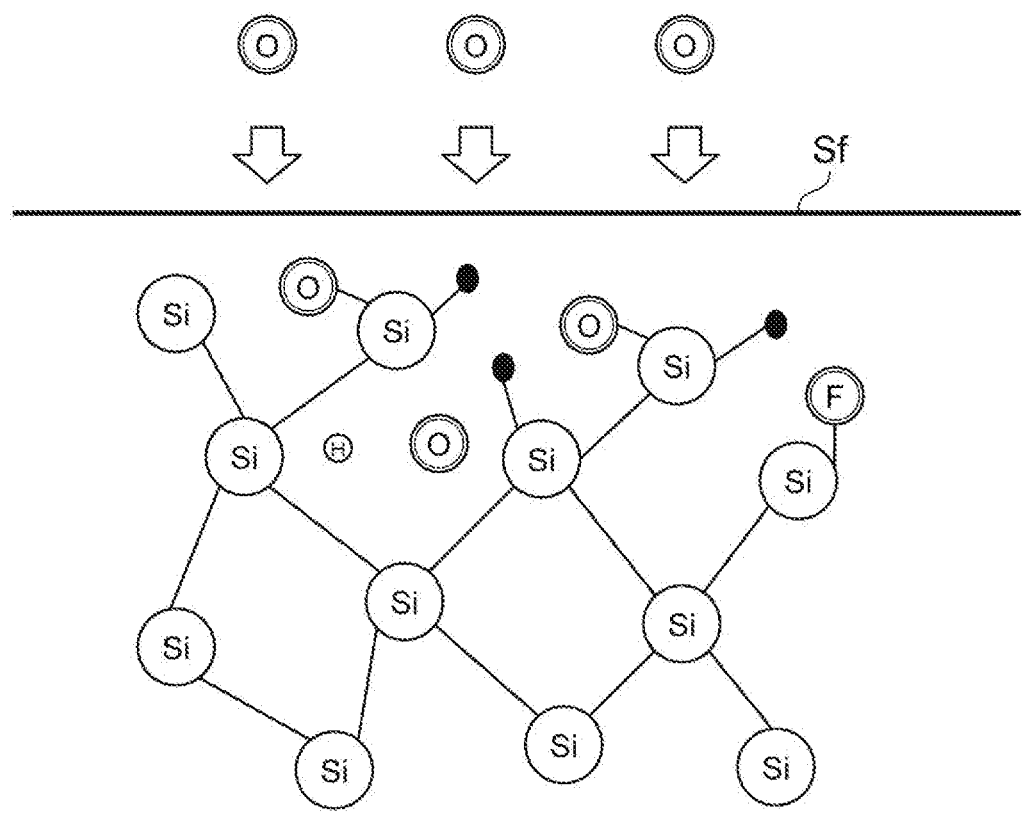
FIG. 9 is a diagram for explaining the oxidation principle of the silicon film using only the oxygen radical.
Figure 10:
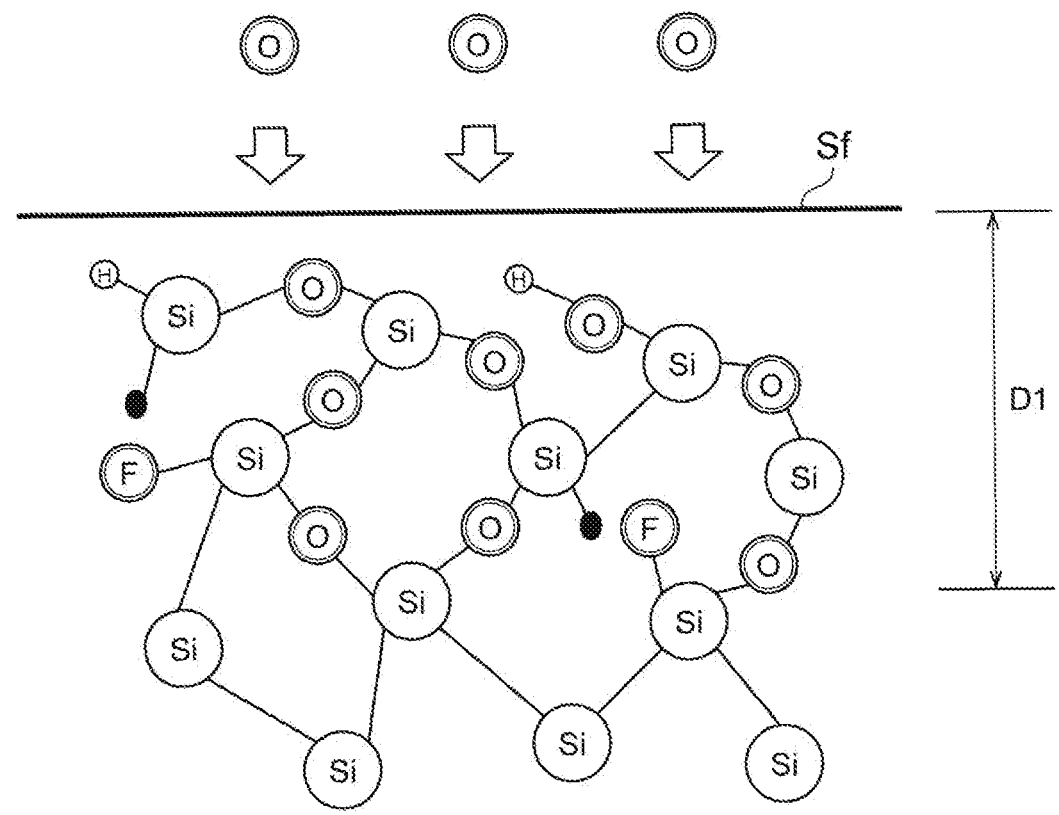
FIG. 10 is a diagram for explaining the oxidation principle of the silicon film using only the oxygen radical.

(Oxidation Principle of Silicon Film: Only Oxygen Radicals) First, a case where the surface of the silicon film is oxidized by plasma of an oxygen gas will be described. FIGS. 8 to 10 are diagrams for explaining the oxidation principle of a silicon film using only oxygen radicals. As illustrated in FIG. 8, in the silicon film, a silicon crystal lattice composed of Si—Si bonds is configured. An oxygen radical generated by dissociation from an oxygen gas is attracted onto the surface Sf of the silicon film.

As illustrated in FIG. 9, the attracted oxygen radical enters in the depth direction from the surface of the silicon layer because the atomic radius of the oxygen radical is smaller than the interstitial distance of the silicon crystal. The entering oxygen radical forms a Si—O bond while breaking a Si—Si bond to generate a dangling bond. Residual atoms such as hydrogen and fluorine are present in the treatment vessel 12, and thus the atoms are also taken into the film. Therefore, for example, a Si—F bond is also Ruined. In a case where the Si—F bond is present in a region of the oxide layer L4, which is close to the surface layer in the first region L41, it is expected that the effect as the sidewall protective film is reduced. Specifically, when silicon is etched by the third halogen atom in the second etching step (S20) being the next step, halogen is contained in the first region L41 of the oxide layer L4 in advance. Therefore, it is expected that the etching of the first region L41 of the oxide layer L4 is accelerated, and the effect as the sidewall protective film is reduced.

As illustrated in FIG. 10, a bond including oxygen is stabilized by an O—Si—O bond. Fluorine causes the Si—F bond to be maintained. Although oxygen radicals enter in the depth direction from the surface of the silicon film, as the entering depth becomes deeper, the energy of the oxygen radicals decreases, and oxidation of the silicon film is not accelerated at a depth which is equal to or greater than a predetermined depth D1 at which the energy is equal to or smaller than energy breaking the Si—Si bond. Therefore, the thickness of the oxidized layer becomes about the depth D1.

(Oxidation Principle of Silicon Film: Oxygen Radical, Fluorine Radical and Hydrogen Radical)

Figure 11:
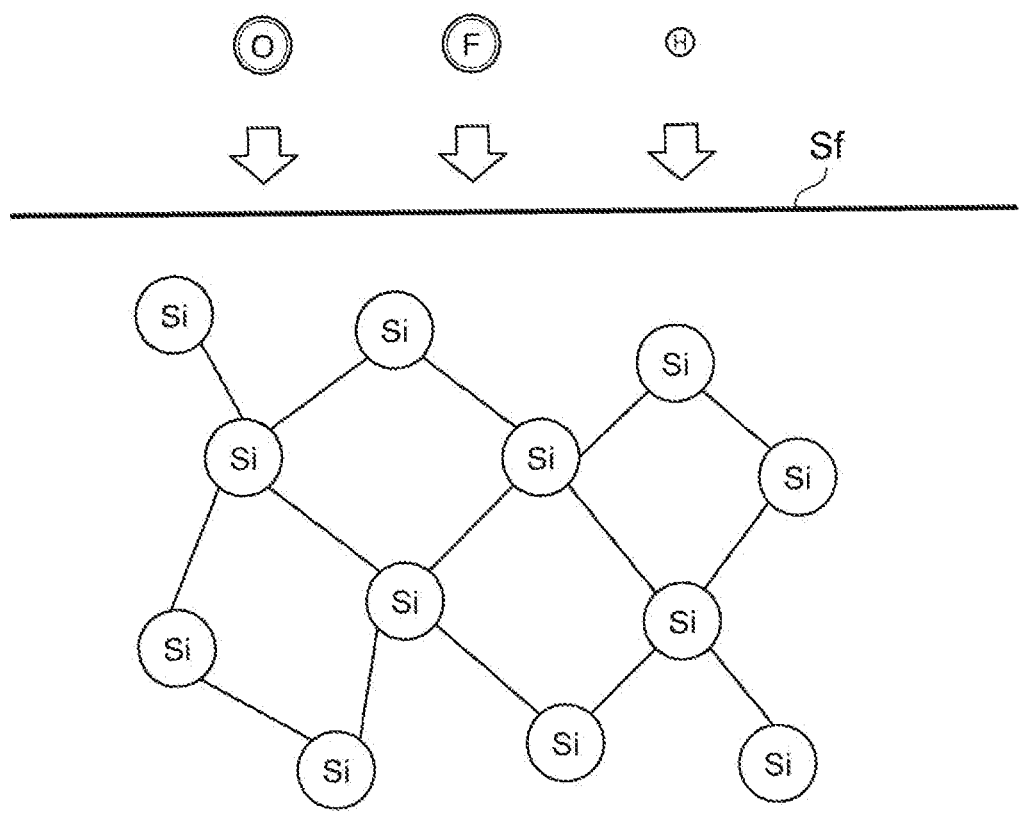
FIG. 11 is a diagram for explaining an oxidation principle of a silicon film using an oxygen radical, a fluorine radical, and a hydrogen radical.
Figure 12:
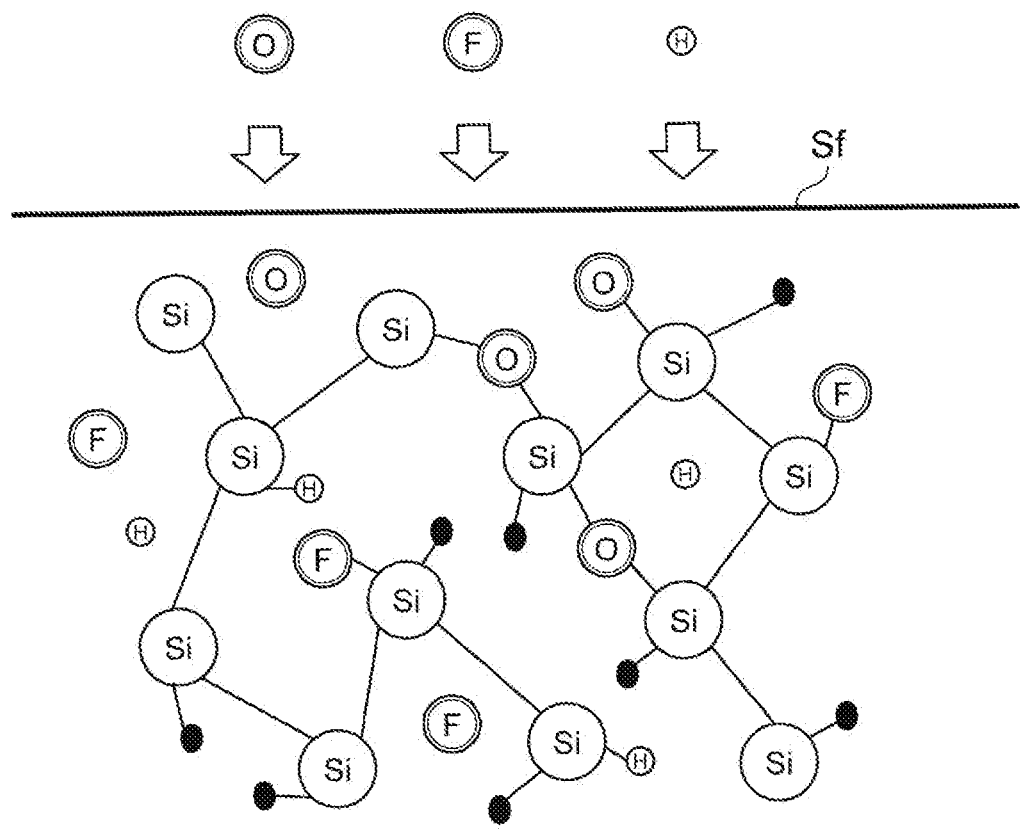
FIG. 12 is a diagram for explaining the oxidation principle of the silicon film using the oxygen radical, the fluorine radical, and the hydrogen radical.
Figure 13:
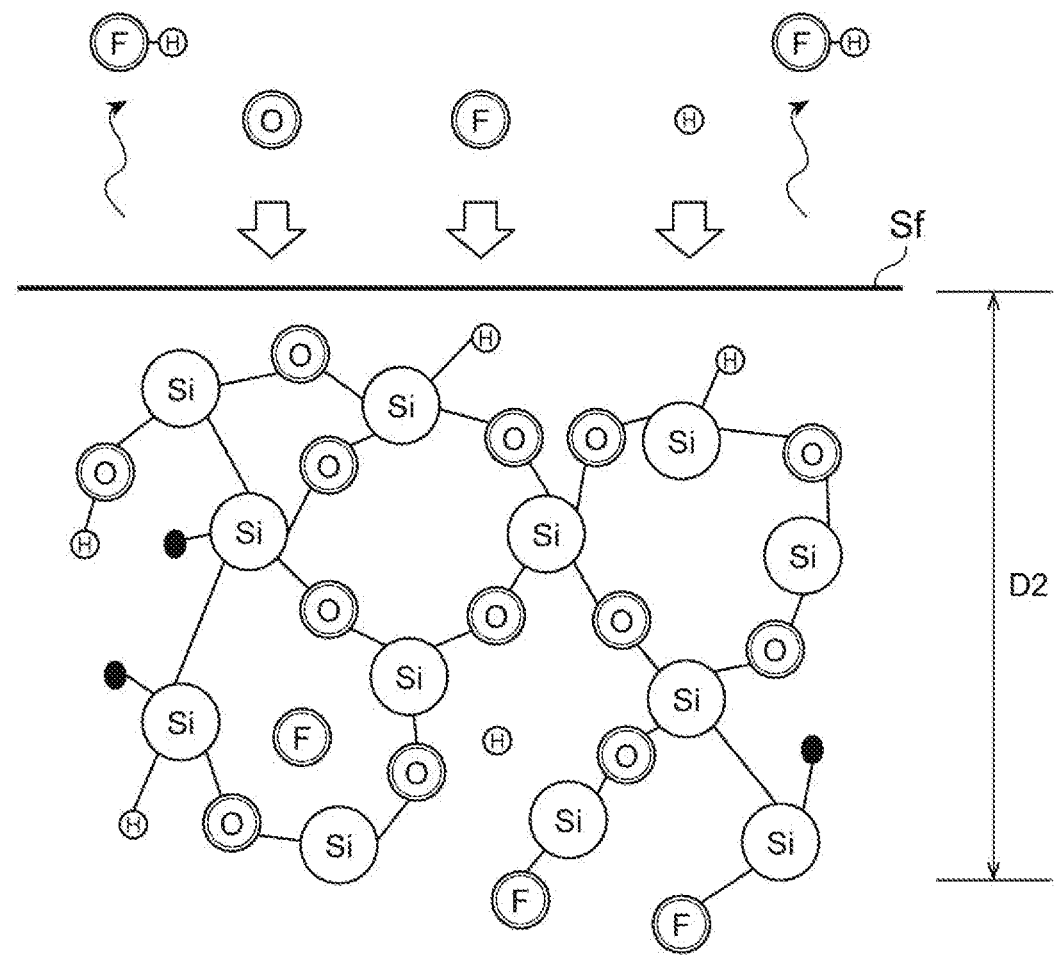
FIG. 13 is a diagram for explaining the oxidation principle of the silicon film using the oxygen radical, the fluorine radical, and the hydrogen radical.

Next, a case where the surface of the silicon film is oxidized by plasma of a gas containing an oxygen atom, a hydrogen atom, and a second halogen atom will be described. FIGS. 11 to 13 are diagrams for explaining the oxidation principle of the silicon film using the oxygen radical, the fluorine radical, and the hydrogen radical. As illustrated in FIG. 11, in the silicon film, a silicon crystal lattice composed of Si—Si bonds is configured. In the treatment vessel 12, for example, plasma of a mixed gas of an oxygen gas and a fluoromethane gas is generated. Thus, oxygen radicals, fluorine radicals, and hydrogen radicals are generated by dissociation from the oxygen gas and the fluoromethane gas. The generated oxygen radicals, fluorine radicals, and hydrogen radicals are attracted onto the surface Sf of the silicon film.

Since the fluorine radical has an atomic radius smaller than the interstitial distance of the silicon crystal, the fluorine radical enters in the depth direction from the surface of the silicon layer. In this state, the fluorine radical has electronegativity higher than that of the oxygen radical. Thus, if the fluorine radical is attracted onto the surface Sf of the silicon film, electrons are pulled out from the silicon crystal lattice to form fluorine negative ions ($F^-$). The $F^-$ ions relatively easily enter into the crystal lattice by an electric field induced as a result, and react with positively-charged silicon. Therefore, the $F^-$ ions have a high ability to break Si—Si bonds and form ionic bonds Si—F. Therefore, as illustrated in FIG. 12, fluorine radicals enter deeply into the silicon film while forming many dangling bonds and Si—F bonds. Oxygen, hydrogen, and fluorine are bonded to the generated dangling bonds to form Si—O bonds, Si—H bonds, and Si—F bonds.

As illustrated in FIG. 13, the bond including oxygen is stabilized by an O—Si—O bond. The fluorine in the surface layer of the silicon film is combined with hydrogen and is removed as an HF gas. Therefore, even though plasma includes fluorine radicals and hydrogen radicals, the surface layer of the silicon film contains little fluorine. The surface layer of the silicon film is an oxide film of high purity and high quality, which mainly contains silicon and oxygen. Although the energy of oxygen radicals decreases as the oxygen radicals enter deeper, dangling bonds are generated to a deep position by the fluorine radicals. Therefore, even though the energy of the oxygen radicals is low, a Si—O bond can be formed. Thus, the thickness of the oxidized layer becomes about a depth D2 which is deeper than the depth D1.

Summary of Embodiment

As described above, according to the method MT and the plasma treatment device 10 according to the exemplary embodiment, the protective film forming step (S16) of modifying the surface of the silicon film L3 into the oxide layer L4 is performed in the process of etching the silicon film L3. In the protective film forming step (S16), the plasma of the gas containing an oxygen atom, a hydrogen atom, and a second halogen atom is used. The oxygen radical causes the surface of the silicon film L3 to be oxidized. At this time, the radical of the second halogen atom enters into silicon crystal from the surface of the silicon film L3. The entering radical of the second halogen atom breaks a Si—Si bond and combines with silicon, or creates a dangling bond of silicon. The oxygen radical can be bonded to the dangling bond of silicon broken by the radical of the second halogen atom. Therefore, the oxygen radical can be bonded to silicon at a deeper position by using the radical of the second halogen atom. Thus, the surface of the silicon film L3 can be modified up to a deeper position.

A hydrogen radical can scavenge an excessive halogen atom which remains on the side wall and the like of a treatment vessel and re-dissociates, or the second halogen atom incorporated into the film. That is, the hydrogen radical can form the oxide layer L4 in which a halogen atom is not contained. As a result, an oxide film having high etching resistance to the radical of the halogen atom is formed.

The high-purity and thick oxide layer L4 as described above is formed on the side wall (second region) of the silicon below the mask MK end. Since the formed oxide layer L4 acts as the sidewall protective film, the progress of etching in the lateral direction is suppressed. Therefore, according to the method MT and the plasma treatment device 10, it is possible to etch the silicon film L3 as designed.

Since the second halogen atom has an atomic radius smaller than the interstitial distance of a silicon crystal, the second halogen atom can enter into the silicon crystal from the surface of the silicon film L3.

In the method MT, it is possible to perform etching to a deeper position while suppressing forming of an abnormal shape, by repeating the protective film forming step (S16), the protective film etching step (S18), and the second etching step (S20).

Since the steps included in the method MT are continuously performed in the same treatment vessel 12, the etching can be completed without transporting the workpiece to the outside of the treatment vessel 12 at all.

Although the various exemplary embodiments have been described above, various omissions, substitutions, and changes may be made without being limited to the exemplary embodiments described above. Other embodiments can be formed by combining elements in different embodiments.

For example, each step of the method MT may be performed by a device using any plasma source other than a plasma treatment device using a microwave. Examples of such a device include a parallel plate type plasma treatment device and an electron cycloton resonance type plasma treatment device. In the method MT, the removal step (S12) may not be performed.

An experimental example performed for evaluating the etching method using the plasma treatment device 10 will be described below. The present disclosure is not limited to experimental examples.

(Verification of Effect of Sidewall Protective Film)

Example 1

A workpiece W was prepared and etched under the following conditions.
First etching step (S14)
Pressure in treatment vessel 12: 60 mTorr (7.99 Pa)
Microwave: 2.45 GHz, 500 W
Radio frequency bias power: 13.56 MHz, 150 W, continuously applied
Treatment Gas
Argon gas flow rate: 400 sccm
Chlorine gas flow rate: 100 sccm
Oxygen gas flow rate: 5 sccm
Treatment time: 60 seconds
Protective film forming step (S16)
Pressure in treatment vessel 12: 100 mTorr (13.33 Pa)
Microwave: 2.45 GHz, 1500 W
Radio frequency bias power: 13.56 MHz, 0 W (not applied)
Treatment Gas
Helium gas flow rate: 300 sccm
Fluoromethane gas flow rate: 45 sccm
Oxygen gas flow rate: 150 sccm
Treatment time: 30 seconds
Protective film etching step (S18)
Pressure in treatment vessel 12: 80 mTorr (10.66 Pa)
Microwave: 2.45 GHz, 500 W
Radio frequency bias power: 13.56 MHz, 150 W, continuously applied
Treatment Gas
Argon gas flow rate: 400 sccm
Fluorocarbon gas flow rate: 25 sccm
Chlorine gas flow rate: 100 sccm
Treatment time: 10 seconds
Second etching step (S20)
Pressure in treatment vessel 12: 120 mTorr (15.99 Pa)
Microwave: 2.45 GHz, 1000 W
Radio frequency bias power: 13.56 MHz, 400 W,
Pulse modulation: 100 Hz, duty ratio 15%
Treatment Gas
Helium gas flow rate: 1000 sccm
Carbon dioxide gas flow rate: 50 sccm
Chlorine gas flow rate: 150 sccm
Fluoromethane gas flow rate: 10 sccm
Treatment time: 20 seconds Comparative Example 1

Comparative Example 1 is different from Example 1 only in the treatment gas in the protective film forming step (S16), and otherwise the same. The treatment gas in the protective film forming step (S16) is as follows.
Treatment gas helium gas flow rate: 300 sccm
Oxygen gas flow rate: 150 sccm Comparative Example 2

Figure 14:
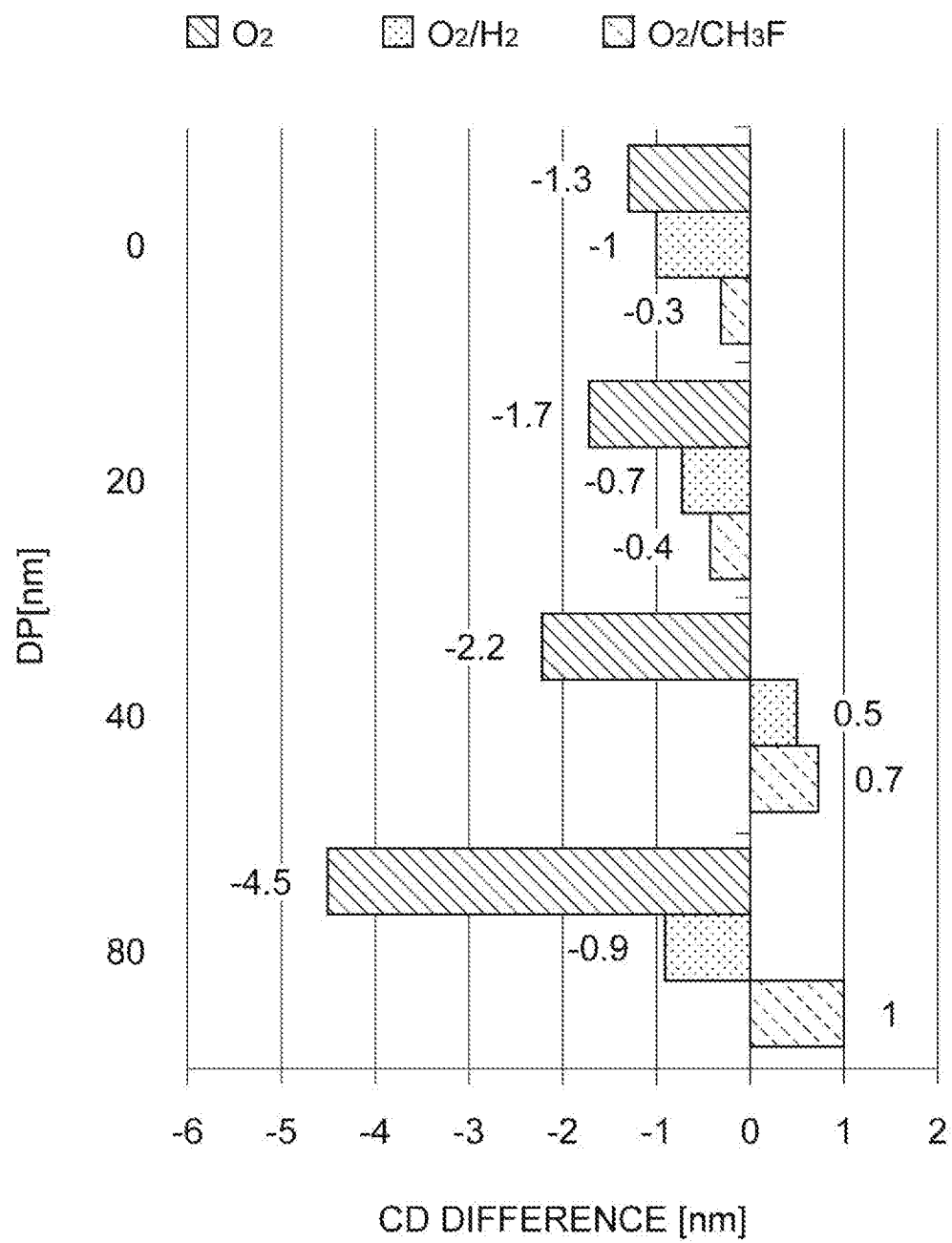
FIG. 14 is a graph illustrating a relationship between a depth DP just below a mask and a CD difference for each gas type.

Comparative Example 2 is different from Example 1 only in the treatment gas in the protective film forming step (S16), and otherwise the same. The treatment gas in the protective film forming step (S16) is as follows.
Treatment Gas
Helium gas flow rate: 300 sccm
Hydrogen gas flow rate: 45 sccm
Oxygen gas flow rate: 150 sccm The effect of the sidewall protective film was verified using Example 1, Comparative Example 1, and Comparative Example 2. A CD difference [nm] was calculated by subtracting CD [nm] when the second etching step (S20) was ended from CD [nm] when the protective film forming step (S16) (see FIG. 7) was ended. CD differences [nm] in a case where DP [nm] (see FIG. 7) were 0, 20, 40, and 80 were calculated, respectively. FIG. 14 shows results.

FIG. 14 is a graph illustrating a relationship between a depth DP just below a mask and a CD difference for each gas type. A horizontal axis indicates the CD difference, and a vertical axis indicates DP. As illustrated in FIG. 14, a case where the CD difference is negative indicates that CD decreases through the steps of the protective film forming step (S16) to the second etching step (S20). Although Comparative Example 1 ($O_2$ in FIG. 14) and Comparative Example 2 ($O_2/H_2$ in FIG. 14) have some errors, it is understood that CD tends to decrease. In particular, the tendency becomes stronger as DP increases. In Example 1 ($O_2/CH_3F$ in FIG. 14), the vicinity of 0 is stable. That is, in Example 1, it was confirmed that the sidewall protective film functioned more sufficiently than those in Comparative Example 1 and Comparative Example 2.

(Verification of Mechanism)

The validity of the mechanism described with reference to FIGS. 8 to 13 was verified. Here, due to the relationship between a measuring instrument and an analyzing instrument, which will be described later, another sample was prepared instead of the example of the workpiece to which the first etching step was performed as illustrated in FIG. 4. Specifically, it was considered that the oxide layer L4 was generated in a manner that, by using a bare silicon substrate, the silicon film L3 of the workpiece W was modified by treating the bare silicon substrate under the following conditions, and forming an oxide film layer on the surface of the bare silicon substrate.

Pressure in treatment vessel 12: 100 mTorr (13.33 Pa)
Microwave: 2.45 GHz, 1500 W
Radio frequency bias power: 0 W
Treatment time: 120 seconds A sample was prepared under the condition in which only the treatment gas was different.

Example 2

Helium gas flow rate: 300 sccm
Fluoromethane gas flow rate: 45 sccm
Oxygen gas flow rate: 150 sccm Comparative Example 3

Helium gas flow rate: 300 sccm
Carbon dioxide gas flow rate: 100 sccm

Comparative Example 4

Helium gas flow rate: 300 sccm
Oxygen gas flow rate: 150 sccm

Comparative Example 5

Figure 15:
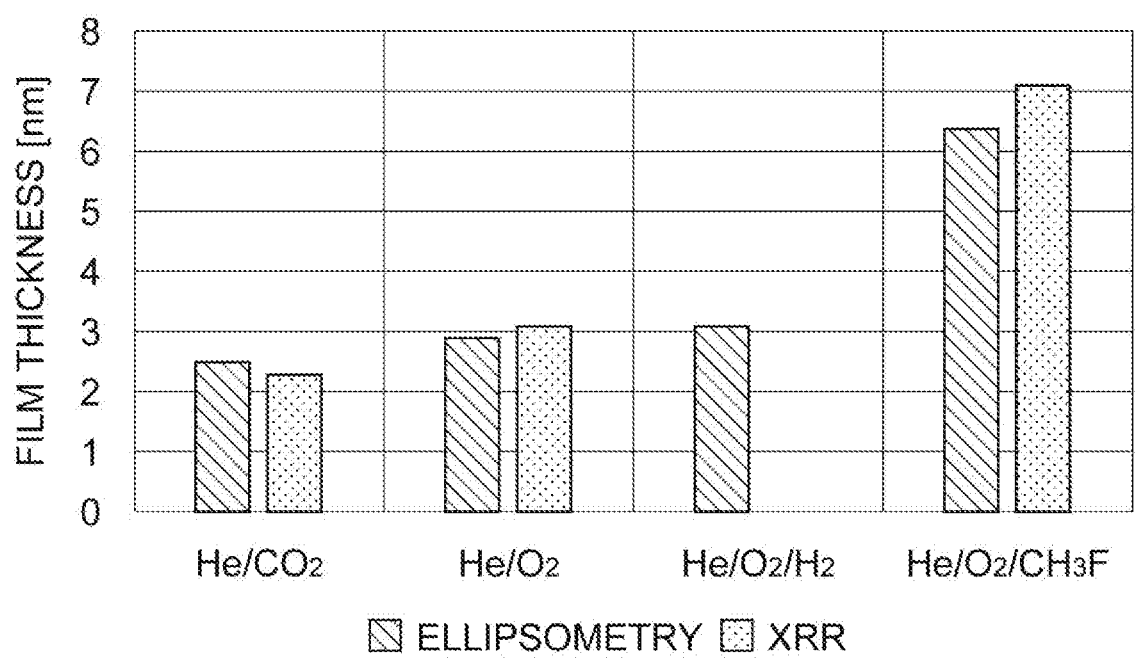
FIG. 15 is a graph illustrating a thickness of an oxide layer for each gas type.

Helium gas flow rate: 300 sccm
Hydrogen gas flow rate: 45 sccm
Oxygen gas flow rate: 150 sccm For the samples of Example 2 and Comparative Examples 3 to 5, the thickness of the oxide layer L4 was measured using ellipsometry and X-ray Reflectivity (XRR). FIG. 15 shows results.

FIG. 15 is a graph illustrating a film thickness of an oxide layer for each gas type. A horizontal axis in FIG. 15 indicates a sample identifier, and a vertical axis indicates a film thickness. As illustrated in FIG. 15, the oxide layer L4 in Comparative Example 3 ($He/CO_2$ in FIG. 15), Comparative Example 4 ($He/O_2$ in FIG. 15), and Comparative Example 5 ($He/O_2/H_2$ in FIG. 15) had a thickness of about 3 nm based on ellipsometry and XRR. That is, it was confirmed that the thickness of the oxide layer L4 was about 3 nm regardless of the measurement device. The oxide layer L4 in Example 2 ($He/O_2/CH_3F$) had a thickness of about 7 nm based on ellipsometry and XRR. That is, it was confirmed that the thickness of the oxide layer L4 was about 7 nm regardless of the measurement device. If Example 2 is compared with Comparative Examples 3 to 5, it was confirmed that the oxide layer L4 in Example 2 was twice as thick as the oxide layer L4 in Comparative Examples 3 to 5.

Figure 16:
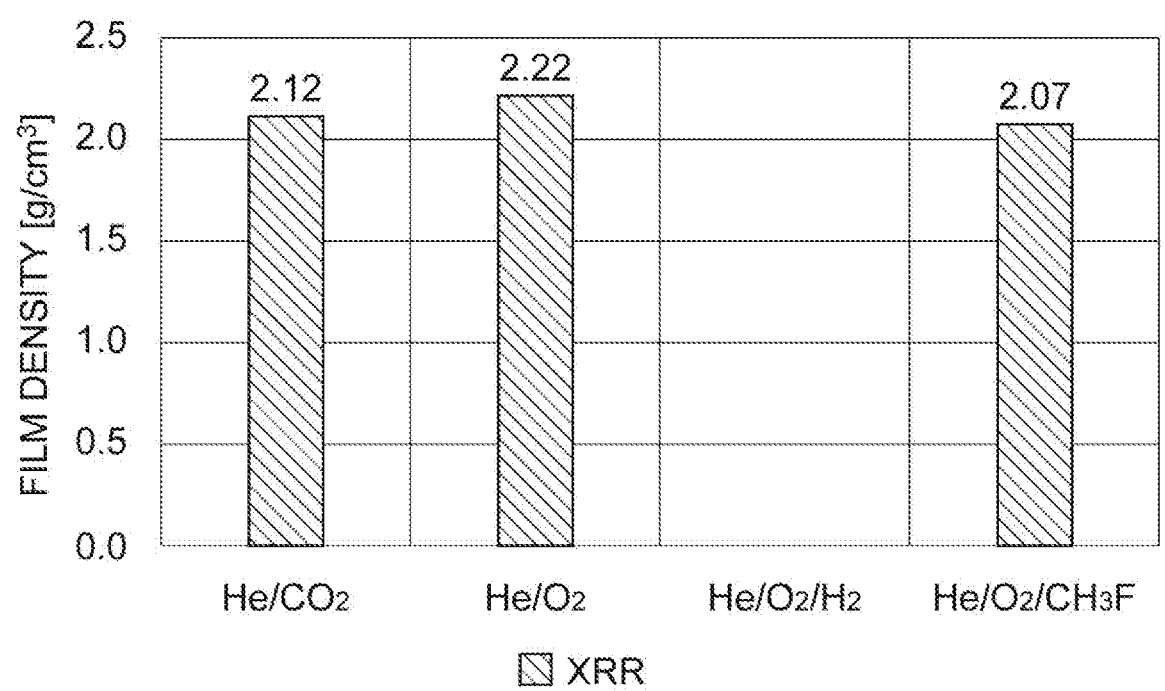
FIG. 16 is a graph illustrating film density of the oxide layer for each gas type.

For the samples in Example 2 and Comparative Examples 3 and 4, the film density of the oxide layer L4 was measured using XRR. FIG. 16 shows results.

FIG. 16 is a graph illustrating film density of the oxide layer for each gas type. In FIG. 16, a horizontal axis indicates the sample identifier, and a vertical axis indicates the film density [$g/cm^3$]. As illustrated in FIG. 16, the oxide layer L4 in Comparative Example 3 ($He/CO_2$ in FIG. 16), Comparative Example 4 ($He/O_2$ in FIG. 16), and Example 2 ($He/O_2/CH_3F$) had film density of about 2 $g/cm^3$. As described above, there was no significant change in the film density in the examples and the comparative examples. Therefore, it is presumed that the increase in the film thickness of the oxide layer L4 greatly affects the effect of the sidewall protective film.

Figure 17:
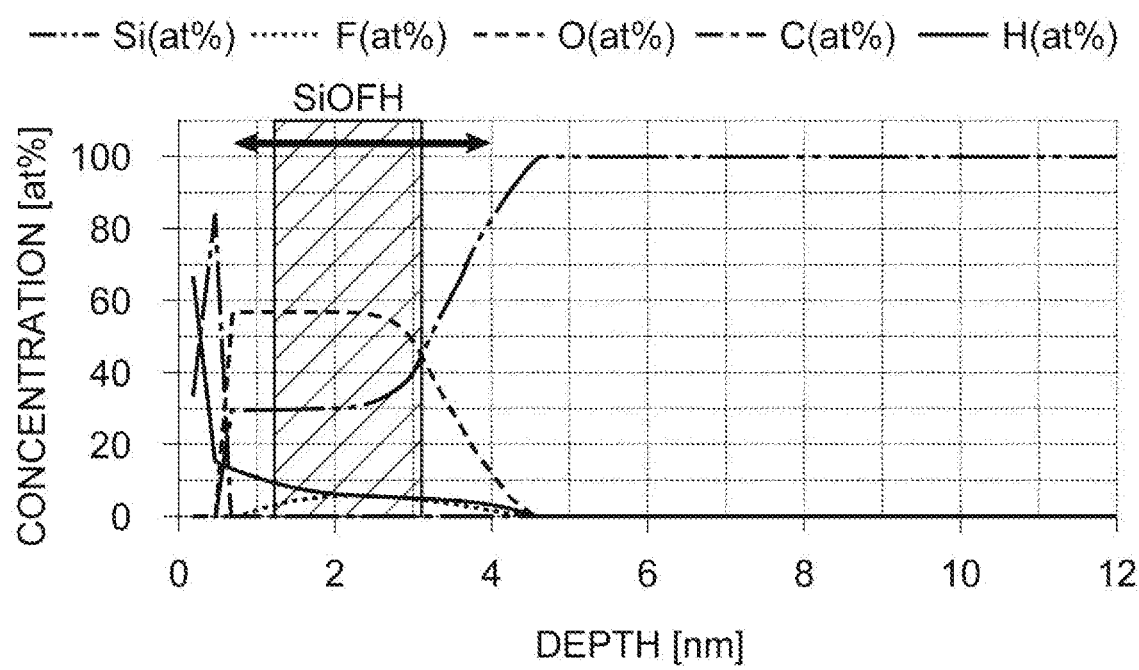
FIG. 17 is a graph illustrating a relationship between a depth and a composition of a silicon film oxidized using plasma of an oxygen gas.
Figure 18:
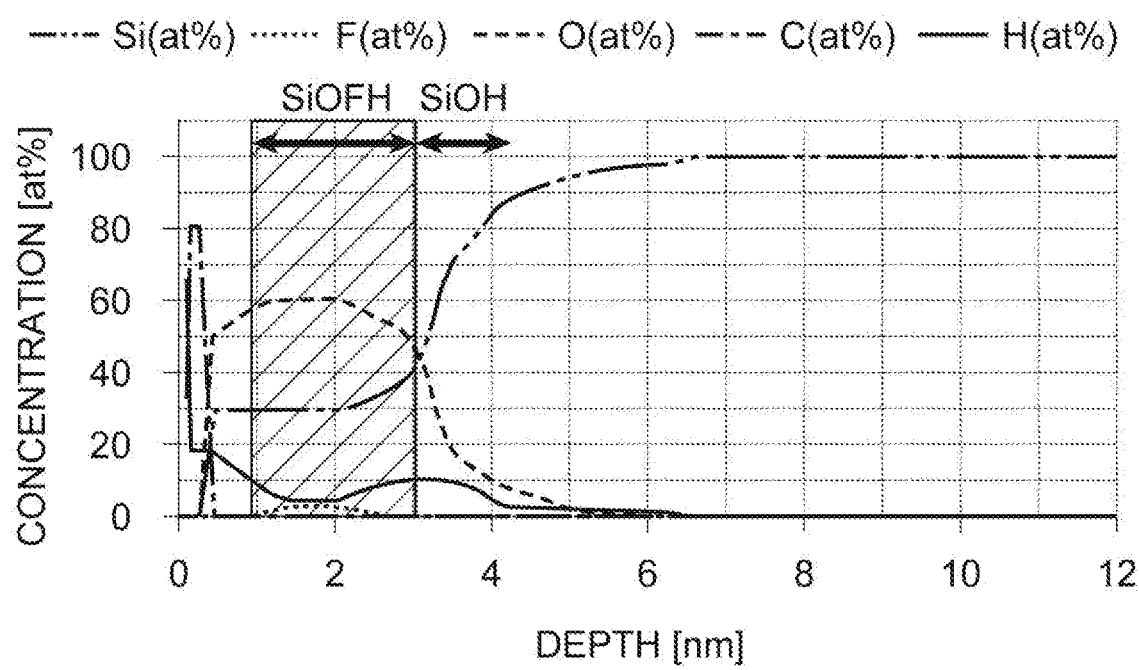
FIG. 18 is a graph illustrating a relationship between a depth and a composition of a silicon film oxidized using plasma of an oxygen gas and a hydrogen gas.
Figure 19:
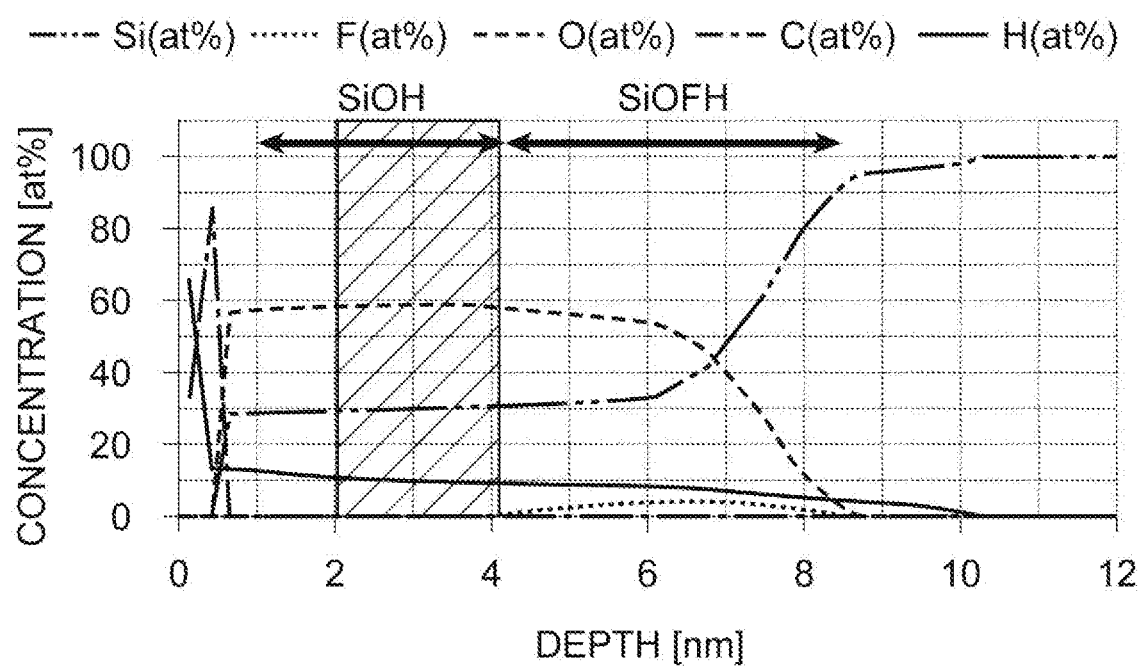
FIG. 19 is a graph illustrating a relationship between a depth and a composition of a silicon film oxidized using plasma of an oxygen gas and a fluoromethane gas.

For the samples in Example 2 and Comparative Examples 4 and 5, the composition in the depth direction was analyzed using High Resolution-Rutherford Back-Scattering Spectroscopy (HR-RBS) and High Resolution-Elastic Recoil Detection Analysis (HR-ERDA). FIGS. 17 to 19 show results. In FIGS. 17 to 19, silicon (Si), fluorine (F), oxygen (O), and carbon (C) were analyzed using HR-RBS, and hydrogen (H) was analyzed using HR-ERDA.

FIG. 17 is a graph illustrating a relationship between the depth and the composition of the silicon film oxidized using plasma of the oxygen gas (graph of Comparative Example 4). In FIG. 17, a horizontal axis in FIG. 17 indicates the depth [nm] from the surface of the silicon film, and a vertical axis indicates the concentration [at %] of each element. As illustrated in FIG. 17, it is understood that the oxygen content decreases from a depth of about 3 nm, and the silicon film is completely formed at a depth of about 4.5 nm. It is understood that fluorine is contained up to a depth of about 4 nm. It is presumed that the fluorine is fluorine which remains on the side wall and the like of the treatment vessel 12 and is re-dissociated. In Comparative Example 4, it was confirmed that the composition of SiOFH was obtained from the surface to the depth of about 4 nm. If the composition of the hatched region in FIG. 17 is represented by numerical values, Si was 32%, F was 5.3%, 0 was 55.9%, and H was 6.8%.

FIG. 18 is a graph illustrating a relationship between the depth and the composition of the silicon film oxidized using plasma of the oxygen gas and the hydrogen gas (graph of Comparative Example 5). In FIG. 18, a horizontal axis in FIG. 17 indicates the depth [mu] from the surface of the silicon film, and a vertical axis indicates the concentration [at %] of each element. As illustrated in FIG. 18, it is understood that the oxygen content decreases from a depth of about 3 nm, and the silicon film is completely formed at a depth of about 5 nm. It is understood that fluorine is contained up to a depth of about 3 nm. It is presumed that the fluorine is fluorine which remains on the side wall and the like of the treatment vessel 12 and is re-dissociated. In Comparative Example 5, it was confirmed that the composition of SiOFH was obtained from the surface to the depth of about 3 nm, and the composition of SiOH was obtained from a depth of 3 to 5 nm. If the composition of the hatched region in FIG. 18 is represented by numerical values, Si was 32.5%, F was 2.1%, 0 was 58.1%, and H was 7.3%.

FIG. 19 is a graph illustrating a relationship between a depth and a composition of a silicon film oxidized using plasma of an oxygen gas and a fluoromethane gas. (Graph of Example 2). In FIG. 19, a horizontal axis in FIG. 17 indicates the depth [nm] from the surface of the silicon film, and a vertical axis indicates the concentration [at %] of each element. As illustrated in FIG. 19, it is understood that the oxygen content decreases from a depth of about 6 nm, and the silicon film is completely formed at a depth of about 9 nm. It is understood that fluorine is contained in a range of 4 nm to 9 nm in depth, and fluorine is hardly contained from the surface up to the depth of about 4 nm. In Example 2, it was confirmed that the composition of SiOH was obtained from the surface to the depth of about 4 nm, and the composition of SiOFH was obtained from a depth of 4 to 9 nm. If the composition of the hatched region in FIG. 19 is represented by numerical values, Si was 30.6%, O was 59.2%, and H was 10.2%.

As illustrated in FIGS. 17 to 19, in Example 2, it was confirmed that fluorine entered deeply into the silicon film as compared with Comparative Examples 4 and 5. That is, it was confirmed that fluorine contributed to an increase in the film thickness of the oxide layer. Further, in Example 2, it was confirmed that the amount of fluorine contained in the surface layer of the silicon film was smaller than that in Comparative Examples 4 and 5. That is, it was confirmed that hydrogen exhibits a scavenging effect to remove fluorine. As described above, the validity of the mechanism described with reference to FIGS. 8 to 13 has been confirmed. In Example 2, it is considered that the fact that the surface layer portion of the silicon film has a composition close to that of pure silicon oxide is also one of the factors that increase the etching resistance.

(Confirmation of Hydrofluorocarbon Conditions)

Figure 20:
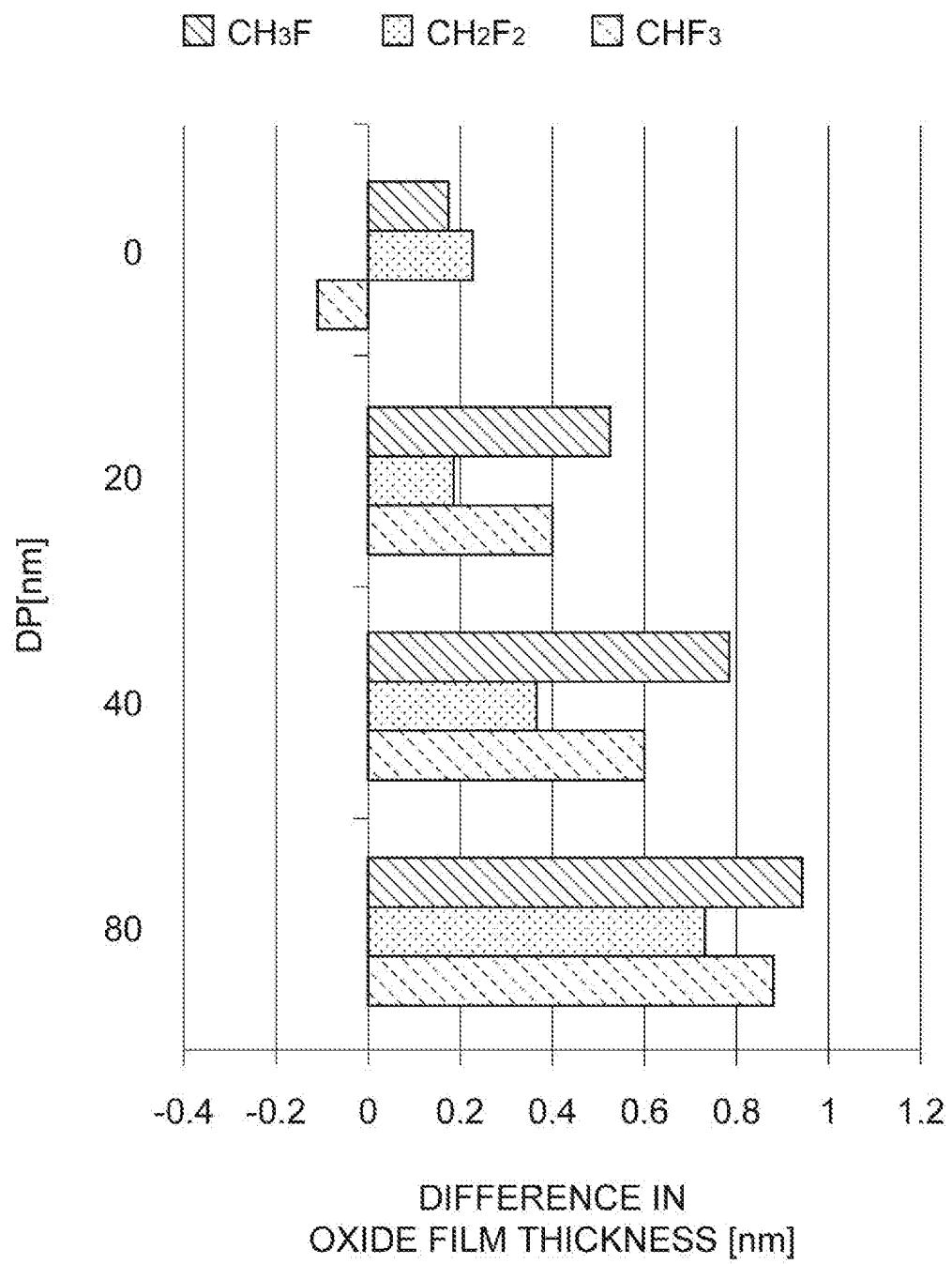
FIG. 20 is a graph illustrating a relationship between the depth DP from a portion just below the mask and a difference in oxide film thickness for each gas type.

Regarding the hydrofluorocarbon ($C_xH_yF_z$) gas, it was verified whether the first region L41 of the oxide layer L4 could be sufficiently formed. As the hydrofluorocarbon gas, a fluoromethane ($CH_3F$) gas, a $C_2H_2F_2$ gas, and a $C_2HF_3$ gas were prepared to form the first region L41 of the oxide layer L4. For the cases, the film thickness of the first region L41 of the oxide layer L4 was measured. The measured film thickness was compared with the film thickness of the first region L41 of the oxide layer L4 formed by an oxygen gas. FIG. 20 shows results.

FIG. 20 is a graph illustrating a relationship between the depth DP from a portion just below the mask and a difference in oxide film thickness for each gas type. In FIG. 20, a horizontal axis indicates a difference [nm] in the oxide film thickness, and a vertical axis indicates DP [nm]. As illustrated in FIG. 20, it was confirmed that a thicker oxide layer was formed in any of the gas types than that in a case where the oxygen gas was used.

The etching shapes of the fluoromethane gas, the $C_2H_2F_2$ gas, and the $C_2HF_3$ gas were confirmed from TEM photographs. As a result obtained by checking CD, it was confirmed that the etching of the $C_2H_2F_2$ gas and the $C_2HF_3$ gas progressed when the oxide layer L4 was framed. Therefore, it was confirmed that y needs to be greater than z.

(Confirmation of Ratio of Mixed Gas when Forming Protective Film)

Figure 21:
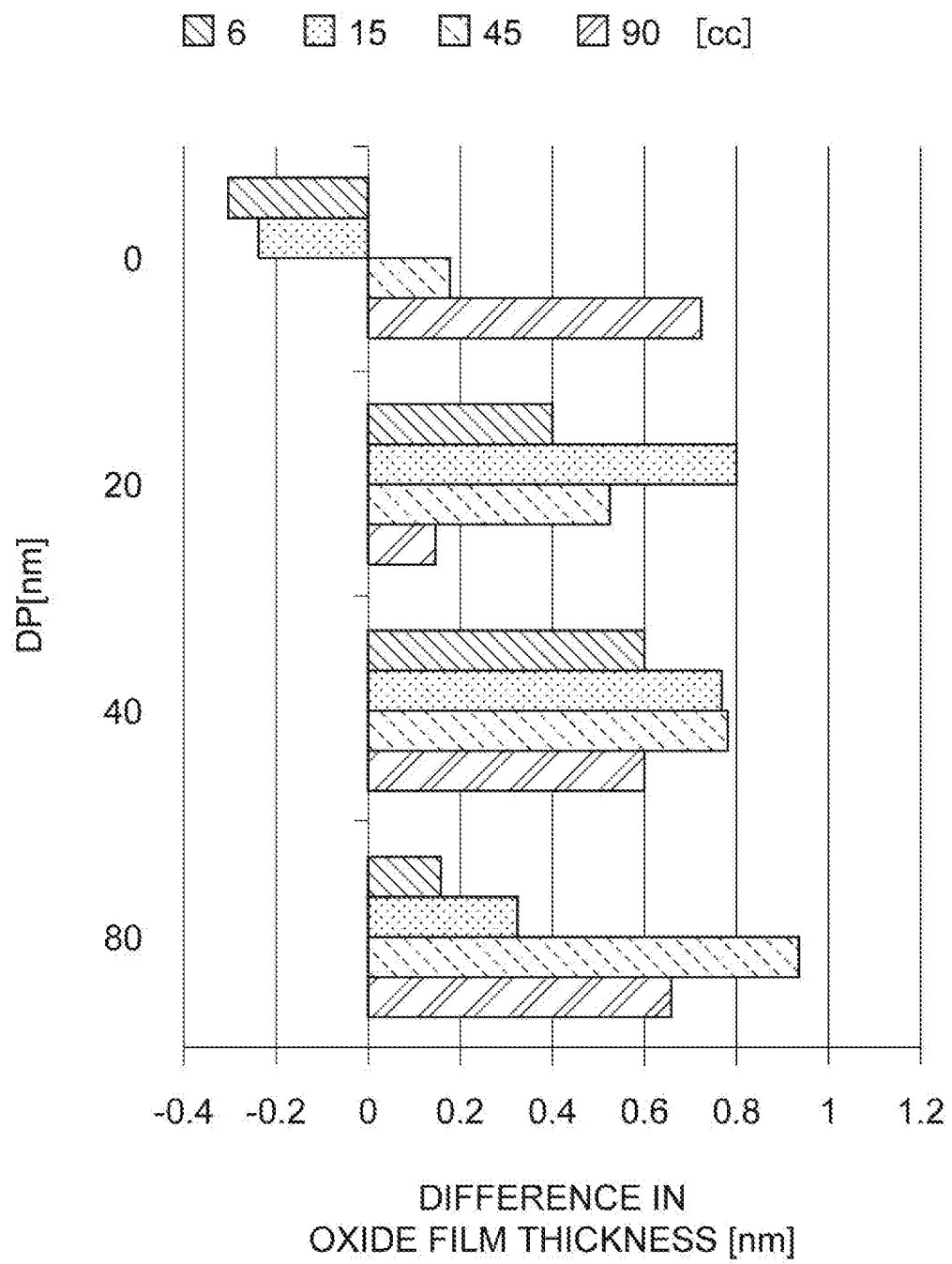
FIG. 21 is a graph illustrating a relationship between the depth DP just below the mask and a difference in oxide film thickness for each flow rate of the fluoromethane gas.

The optimum value of a mixing ratio between the oxygen gas and the hydrofluorocarbon gas was verified. Specifically, the oxide layer L4 was formed by changing the ratio of the fluoromethane gas to the oxygen gas. For the cases, the film thickness of the first region L41 of the oxide layer L4 was measured. The measured film thickness was compared with the film thickness of the first region L41 of the oxide layer L4 formed by an oxygen gas. FIG. 21 shows results.

FIG. 21 is a graph illustrating a relationship between the depth DP just below the mask and a difference in oxide film thickness for each flow rate of the fluoromethane gas. In FIG. 21, a horizontal axis indicates a difference [nm] in the oxide film thickness, and a vertical axis indicates DP [nm]. The difference in the film thickness of the oxide layer L4 was measured every time the flow rate of the oxygen gas was 150 cc, and the flow rate of the fluoromethane gas was 6 cc, 15 cc, 45 cc, and 90 cc. As illustrated in FIG. 21, it was confirmed that the minimum flow rate of the fluoromethane gas exhibiting the effect of forming the protective film was 45 cc. That is, it was confirmed that oxygen:fluoromethane=150:45=1:0.3.

Figure 22:
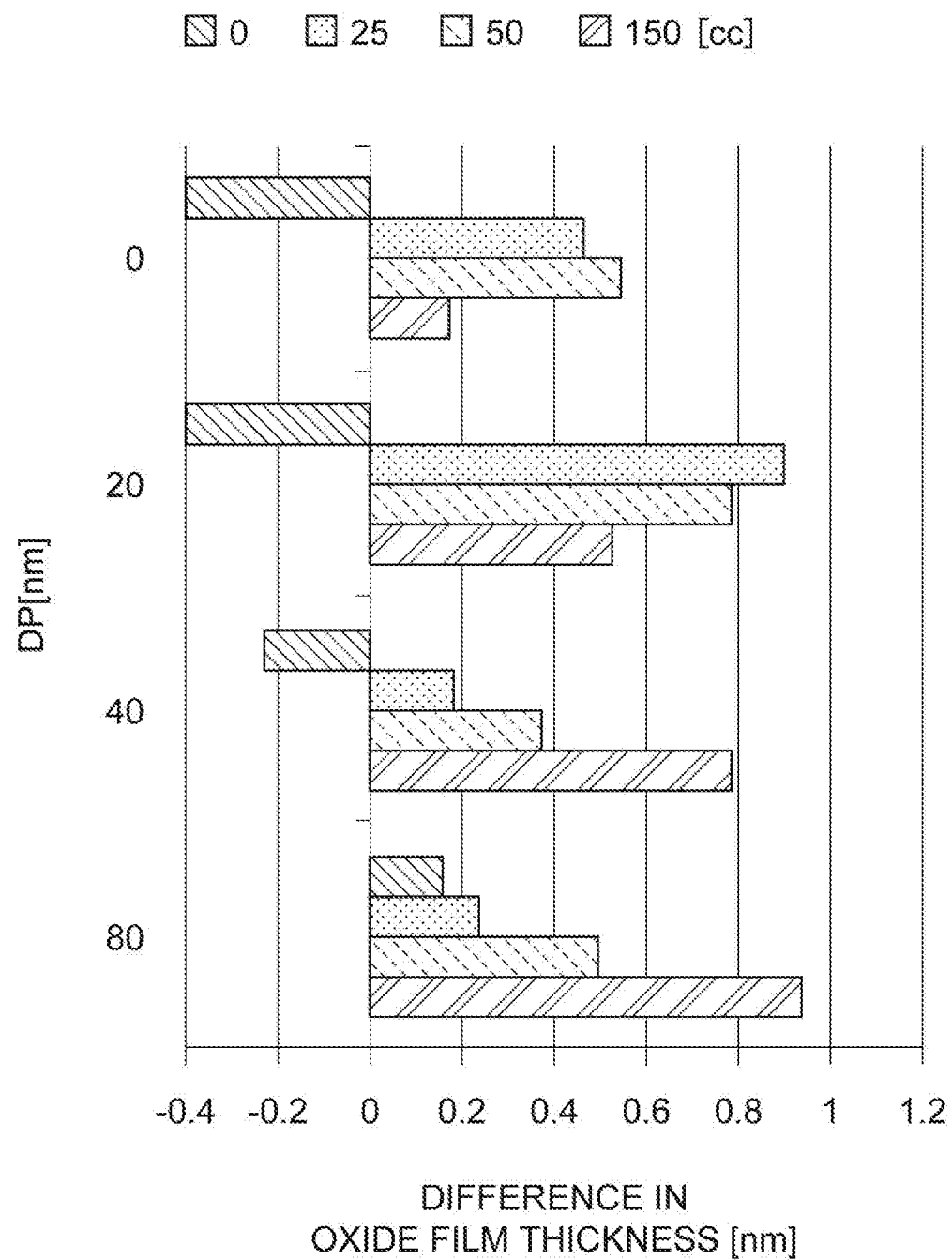
FIG. 22 is a graph illustrating a relationship between the depth DP just below the mask and a difference in oxide film thickness for each flow rate of the oxygen gas.

FIG. 22 is a graph illustrating a relationship between the depth DP just below the mask and a difference in oxide film thickness for each flow rate of the oxygen gas. In FIG. 22, a horizontal axis indicates a difference [nm] in the oxide film thickness, and a vertical axis indicates DP [nm]. The difference in the film thickness of the oxide layer L4 was measured every time the flow rate of the fluoromethane gas was 45 cc, and the flow rate of the oxygen gas was 0 cc, 25 cc, 50 cc, and 150 cc. As illustrated in FIG. 22, it was confirmed that the minimum flow rate of the oxygen gas exhibiting the effect of forming the protective film was 25 cc. That is, it was confirmed that oxygen:fluoromethane=25:45=1:1.8. Based on the results of FIGS. 21 and 22, it was confirmed that, if the gas containing the oxygen atom is set to 1, the hydrofluorocarbon gas might be in a range of 0.3 to 1.8.

(Treatment Time Dependency)

Figure 23:
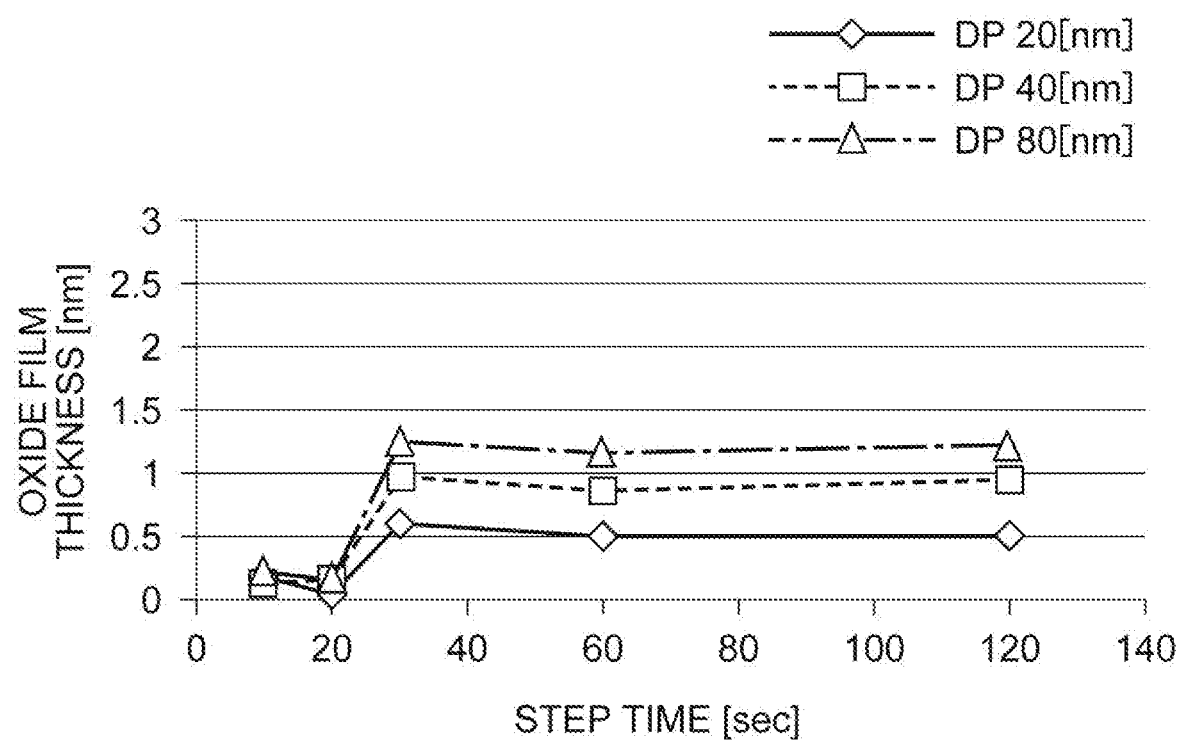
FIG. 23 is a graph illustrating a relationship between a step time and the oxide film thickness in a case where oxidation is performed using the plasma of the oxygen gas, for each depth DP from the portion just below the mask.

Time dependency of the thickness of the oxide layer was verified using Example 2 and Comparative Example 4. FIG. 23 is a graph illustrating a relationship between a step time and the oxide film thickness in a case where oxidation is performed using the plasma of the oxygen gas, for each depth DP from the portion just below the mask (graph of Comparative Example 4). In FIG. 23, a horizontal axis indicates a step time [sec], and a vertical axis indicates the oxide film thickness [nm]. As illustrated in FIG. 23, in a case where the step time was 30 seconds or longer, it was confirmed that the oxide film thickness did not increase at any depth.

Figure 24:
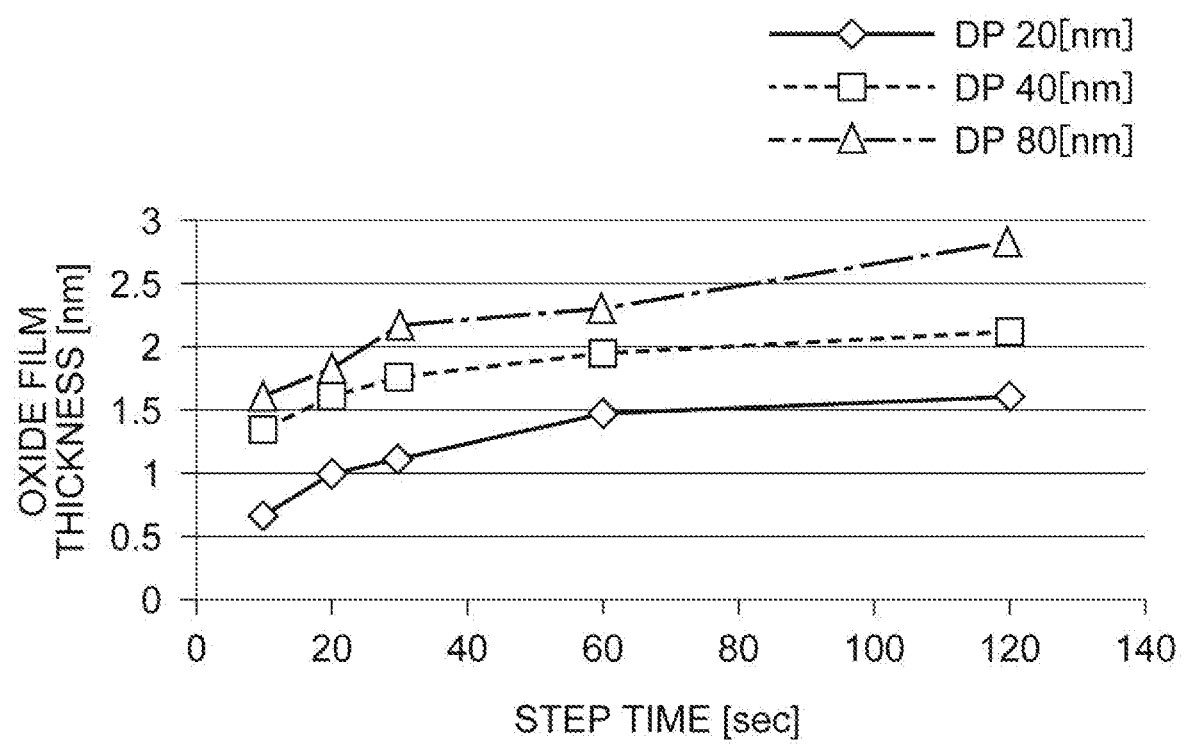
FIG. 24 is a graph illustrating a relationship between the step time and the oxide film thickness in a case where oxidation is performed using the plasma of the oxygen gas and the fluoromethane gas, for each depth DP from the portion just below the mask.

FIG. 24 is a graph illustrating a relationship between the step time and the oxide film thickness in a case where oxidation is performed using the plasma of the oxygen gas and the fluoromethane gas, for each depth DP from the portion just below the mask (graph of Example 2). In FIG. 24, a horizontal axis in FIG. 24 indicates the step time [sec], and a vertical axis indicates the oxide film thickness [nm]. As illustrated in FIG. 24, it was confirmed that the oxide film thickness increased depending on the step time, although the oxide film thickness had a tendency of slight saturation at any depth.

From the results of FIGS. 23 and 24, it was confirmed that it was possible to easily control the film thickness and to form an oxide film thicker than that of Comparative Example 4, by using the treatment gas in Example 2.

From the above description, it will be understood that various embodiments of the present disclosure have been described for purposes of explanation in the present specification, and that various changes may be made without departing from the scope and spirit of the present disclosure. Accordingly, the various embodiments disclosed in the present specification are not intended to limit, and the true scope and spirit are indicated by the appended claims.

REFERENCE SIGNS LIST

10 . . . Plasma treatment device, 12 . . . Treatment vessel, 14 . . . Antenna, 18 . . . Dielectric window, 20 . . . Mounting stand, 30 ... Exhaust device, 32 ... Microwave generator, 42 ... Dielectric plate, 44 ... Slot plate, W ... Workpiece (wafer)

The invention claimed is:

1. An etching method comprising:
preparing a workpiece including a silicon film and a mask provided on the silicon film;
etching the silicon film using the mask by plasma of a gas containing a first halogen atom;
modifying a surface of the silicon film into an oxide layer by plasma of a gas containing an oxygen atom, a hydrogen atom, and a second halogen atom, the oxide layer including a first region extending along a side wall surface of the mask and a second region extending on the silicon film;
etching the oxide layer to remove the second region while leaving the first region; and
etching the silicon film using the mask and the oxide layer including the first region by plasma of a gas containing a third halogen atom.

2. The etching method according to claim 1, wherein
in the modifying the surface of the silicon film into the oxide layer, bias power is not applied to the workpiece.

3. The etching method according to claim 1, wherein
the modifying the surface of the silicon film into the oxide layer, the etching the oxide layer, and the etching the silicon film using the mask and the oxide layer including the first region are repeated.

4. The etching method according to claim 1, wherein
the etching the silicon film using the mask, the modifying the surface of the silicon film into the oxide layer, the etching the oxide layer, and the etching the silicon film using the mask and the oxide layer including the first region are performed continuously in the same treatment vessel or in a consistent vacuum environment.

5. The etching method according to claim 1, wherein
the gas containing the oxygen atom, the hydrogen atom, and the second halogen atom is a mixed gas of a gas containing an oxygen atom and a gas containing a hydrogen atom and the second halogen atom.

6. The etching method according to claim 1, wherein
the gas containing the oxygen atom, the hydrogen atom, and the second halogen atom is a mixed gas of a gas containing an oxygen atom, a gas containing a hydrogen atom, and a gas containing the second halogen atom.

7. The etching method according to claim 1, wherein
the gas containing the oxygen atom, the hydrogen atom, and the second halogen atom is a gas including a molecule containing an oxygen atom, a hydrogen atom, and the second halogen atom.

8. The etching method according to claim 1, wherein
the second halogen atom has an atomic radius smaller than an interstitial distance of a silicon crystal.

9. An etching method comprising:
preparing a workpiece including a silicon film and a mask provided on the silicon film;
etching the silicon film using the mask by plasma of a gas containing a first halogen atom;
modifying a first region extending along a side wall surface of the mask in the surface of the silicon film into an oxide layer by plasma of a gas containing an oxygen atom, a hydrogen atom, and a second halogen atom; and
etching the silicon film using the mask and the oxide layer including the first region by plasma of a gas containing a third halogen atom.

10. The etching method according to claim 9, wherein
in the modifying the first region into the oxide layer, bias power is applied to the workpiece.

11. The etching method according to claim 9, wherein
in the modifying the first region into the oxide layer, in a second region extending on the silicon film in the surface of the silicon, an etching rate at which the oxide layer is etched by ions which are generated from the plasma of the gas containing the oxygen atom, the hydrogen atom, and the second halogen atom and contain the second halogen atom is faster than or equal to a modification rate at which the silicon film is modified into the oxide layer by the plasma of the gas containing the oxygen atom, the hydrogen atom, and the second halogen atom.

12. The etching method according to claim 9, wherein
the gas containing the oxygen atom, the hydrogen atom, and the second halogen atom is a mixed gas of a gas containing an oxygen atom and a gas containing a hydrogen atom and the second halogen atom.

13. The etching method according to claim 9, wherein
the gas containing the oxygen atom, the hydrogen atom, and the second halogen atom is a mixed gas of a gas containing an oxygen atom, a gas containing a hydrogen atom, and a gas containing the second halogen atom.

14. The etching method according to claim 9, wherein
the gas containing the oxygen atom, the hydrogen atom, and the second halogen atom is a gas including a molecule containing an oxygen atom, a hydrogen atom, and the second halogen atom.

15. The etching method according to claim 9, wherein
the second halogen atom has an atomic radius smaller than an interstitial distance of a silicon crystal.

16. A plasma treatment device that etches a workpiece including a silicon film and a mask provided on the silicon film, the device comprising:
a treatment vessel that is provided for defining a treatment space in which plasma is generated;
a gas supply unit that supplies a treatment gas into the treatment space;
a plasma generation source that generates plasma of a gas supplied into the treatment vessel; and
a controller that controls the gas supply unit and the plasma generation source, wherein
the controller is configured to perform
etching the silicon film using the mask by plasma of a gas containing a first halogen atom,
modifying a surface of the silicon film into an oxide layer by plasma of a gas containing an oxygen atom, a hydrogen atom, and a second halogen atom, the oxide layer including a first region extending along a side wall surface of the mask and a second region extending on the silicon film,
etching the oxide layer to remove the second region while leaving the first region, and
etching the silicon film using the mask and the oxide layer including the first region by plasma of a gas containing a third halogen atom.

17. The plasma treatment device according to claim 16, wherein
in the modifying the surface of the silicon film into the oxide layer, bias power is not applied to the workpiece.

18. A plasma treatment device that etches a workpiece including a silicon film and a mask provided on the silicon film, the device comprising:

a treatment vessel that is provided for defining a treatment space in which plasma is generated;

a gas supply unit that supplies a treatment gas into the treatment space;

a plasma generation source that generates plasma of a gas supplied into the treatment vessel; and a controller that controls the gas supply unit and the plasma generation source, wherein the controller is configured to perform:
- etching the silicon film using the mask by plasma of a gas containing a first halogen atom,
- modifying a first region extending along a side wall surface of the mask in the surface of the silicon film into an oxide layer by plasma of a gas containing an oxygen atom, a hydrogen atom, and a second halogen atom, and
- etching the silicon film using the mask and the oxide layer including the first region by plasma of a gas containing a third halogen atom.

19. The plasma treatment device according to claim 18, wherein
in the modifying the first region into the oxide layer, bias power is applied to the workpiece.

\* \* \* \* \*